United States Patent
Li

(10) Patent No.: US 12,500,203 B2
(45) Date of Patent: *Dec. 16, 2025

(54) SEMICONDUCTOR PACKAGING METHOD, SEMICONDUCTOR ASSEMBLY AND ELECTRONIC DEVICE COMPRISING SEMICONDUCTOR ASSEMBLY

(71) Applicant: Yibu Semiconductor Co., Ltd., Shanghai (CN)

(72) Inventor: Weiping Li, Shanghai (CN)

(73) Assignee: Yibu Semiconductor Co., Ltd., Shanghai (CN)

( * ) Notice: Subject to any disclaimer, the term of this patent is extended or adjusted under 35 U.S.C. 154(b) by 970 days.

This patent is subject to a terminal disclaimer.

(21) Appl. No.: 17/676,700

(22) Filed: Feb. 21, 2022

(65) Prior Publication Data

US 2022/0271002 A1 Aug. 25, 2022

Related U.S. Application Data

(63) Continuation-in-part of application No. 17/589,881, filed on Jan. 31, 2022, now Pat. No. 12,154,884, (Continued)

(30) Foreign Application Priority Data

Feb. 22, 2021 (CN) .......................... 202110198874.2

(51) Int. Cl.
*H01L 23/00* (2006.01)
*H01L 21/56* (2006.01)
(Continued)

(52) U.S. Cl.
CPC .............. *H01L 24/81* (2013.01); *H01L 21/56* (2013.01); *H01L 23/485* (2013.01);
(Continued)

(58) Field of Classification Search
CPC ........ H01L 24/81; H01L 21/56; H01L 23/485
See application file for complete search history.

(56) References Cited

U.S. PATENT DOCUMENTS

| | | | |
|---|---|---|---|
| 5,399,898 A | 3/1995 | Rostoker | |
| 5,600,180 A | 2/1997 | Kusaka | |

(Continued)

FOREIGN PATENT DOCUMENTS

| | | | |
|---|---|---|---|
| CN | 1949499 A | 4/2007 | |
| CN | 102148173 A | 8/2011 | |

(Continued)

OTHER PUBLICATIONS

Shanghai Yibu Semiconductor Co., Ltd., English Translation of KR First Office Action, KR 10-2022-0074762, Mar. 28, 2023, 7 pgs.
(Continued)

*Primary Examiner* — Mohammad M Choudhry
(74) *Attorney, Agent, or Firm* — USCH Law, PC

(57) ABSTRACT

A semiconductor packaging method, a semiconductor assembly and an electronic device are disclosed herein. The semiconductor packaging method comprises forming a first-level assembly, including: align and fix at least one first-level device to a target position on a carrier plate by utilizing the self-alignment capability of first-level alignment solder joints; encapsulating the at least one first-level device to form a molded package body; and exposing the first-level interconnect terminals from the molded package body. The packaging method further comprises align and fix a second-level device to a target position on the first-level assembly by utilizing the self-alignment capability of second-stage alignment solder joints between the first-level assembly and the second-level device. The packaging method improves the operation speed and accuracy of the picking and placing (Continued)

of the first-level device and the second-level device, resulting in improved process efficiency and reduced process cost.

11 Claims, 12 Drawing Sheets

Related U.S. Application Data which is a continuation-in-part of application No. 17/562,939, filed on Dec. 27, 2021, now Pat. No. 12,159,850.

(51) Int. Cl.
  *H01L 23/485* (2006.01)
  *H01L 25/00* (2006.01)
  *H01L 25/10* (2006.01)
(52) U.S. Cl.
  CPC ............ *H01L 25/105* (2013.01); *H01L 25/50* (2013.01); *H01L 2224/81143* (2013.01); *H01L 2224/81203* (2013.01)

(56) References Cited

U.S. PATENT DOCUMENTS

| | | | |
|---|---|---|---|
| 6,809,421 | B1 | 10/2004 | Hayasaka |
| 7,446,419 | B1 | 11/2008 | Lin |
| 10,504,826 | B1 | 12/2019 | Fillion |
| 10,847,435 | B2 | 11/2020 | Kim et al. |
| 2003/0000738 | A1 | 1/2003 | Rumsey |
| 2003/0062631 | A1 | 4/2003 | Nemoto |
| 2004/0262774 | A1 | 12/2004 | Kang |
| 2006/0177965 | A1 | 8/2006 | Senda |
| 2007/0126111 | A1 | 6/2007 | Mirsky |
| 2007/0205520 | A1 | 9/2007 | Chou et al. |
| 2008/0284408 | A1 | 11/2008 | Kunst et al. |
| 2009/0039526 | A1 | 2/2009 | Wang |
| 2009/0057866 | A1 | 3/2009 | Chow |
| 2009/0130838 | A1 | 5/2009 | Sakaguchi |
| 2011/0071397 | A1 | 3/2011 | Wodnicki |
| 2011/0074004 | A1 | 3/2011 | Shen |
| 2012/0013001 | A1* | 1/2012 | Haba .................. H01L 25/0657 257/737 |
| 2012/0032321 | A1 | 2/2012 | West |
| 2012/0146216 | A1 | 6/2012 | Kang |
| 2013/0059416 | A1 | 3/2013 | Liu et al. |
| 2013/0234317 | A1 | 9/2013 | Chen |
| 2013/0244382 | A1 | 9/2013 | Clark |
| 2013/0248237 | A1 | 9/2013 | Zhou |
| 2013/0292843 | A1 | 11/2013 | Lee |
| 2015/0255415 | A1 | 9/2015 | De Bonis |
| 2017/0025387 | A1 | 1/2017 | Ichikawa |
| 2017/0098631 | A1* | 4/2017 | Kikuchi .................. H01L 24/81 |
| 2017/0358554 | A1 | 12/2017 | Chen et al. |
| 2019/0103375 | A1 | 4/2019 | Huang |
| 2020/0006241 | A1 | 1/2020 | Wu |
| 2020/0161183 | A1 | 5/2020 | Lai et al. |
| 2020/0321234 | A1 | 10/2020 | Choi |
| 2020/0365547 | A1 | 11/2020 | Yang |
| 2021/0343692 | A1* | 11/2021 | Wirz ....................... H01L 24/97 |

FOREIGN PATENT DOCUMENTS

| | | |
|---|---|---|
| CN | 102194718 A | 9/2011 |
| CN | 103295991 A | 9/2013 |
| CN | 103890933 A | 6/2014 |
| CN | 103915355 A | 7/2014 |
| CN | 104037153 A | 9/2014 |
| CN | 104380465 A | 2/2015 |
| CN | 104505351 A | 4/2015 |
| CN | 102983087 B | 6/2015 |
| CN | 105244341 A | 1/2016 |
| CN | 105448862 A | 3/2016 |
| CN | 108028239 A | 5/2018 |
| CN | 109585312 A | 4/2019 |
| CN | 112018047 A | 12/2020 |
| JP | 06112463 A | 4/1994 |
| JP | H06112463 A | 11/1999 |
| JP | H11317468 A | 11/1999 |
| JP | 2004253598 A | 9/2004 |
| JP | 2005236232 A | 9/2005 |
| JP | 2007189066 A | 7/2007 |
| JP | 2007329503 A | 12/2007 |
| JP | 2008171879 A | 7/2008 |
| JP | 2011071259 A | 4/2011 |
| KR | 20140070602 A | 6/2014 |
| KR | 20170026170 A | 2/2019 |
| TW | 521411 B | 2/2003 |
| TW | 200531234 A | 9/2005 |
| TW | 201032307 A | 9/2010 |
| TW | 201225193 A | 6/2012 |
| TW | M507066 U | 8/2015 |
| TW | 201642360 A | 12/2016 |
| TW | I578421 B | 4/2017 |
| TW | I605526 B | 11/2017 |
| TW | 201917835 A | 5/2019 |
| TW | 201921620 A | 6/2019 |
| TW | 202101635 A | 1/2021 |
| TW | 202103249 A | 1/2021 |
| TW | 202133279 A | 9/2021 |

OTHER PUBLICATIONS

Shanghai Yibu Semiconductor Co., Ltd., KR First Office Action with English Translation, KR 10-2021-01640040, Mar. 29, 2023, 11 pgs.
Shanghai Yibu Semiconductor Co., Ltd., KR Second Office Action with English Translation, KR 10-2021-01640040, Nov. 26, 2023, 13 pgs.
Shanghai Yibu Semiconductor Co., Ltd., KR First Office Action with English Translation, KR 10-2021-0164048, Nov. 6, 2023, 11 pgs.
Weiping Li, U.S. Appl. No. 17/535,983, Non-Final Office Action issued Jun. 30, 2023.
Weiping Li, U.S. Appl. No. 17/535,986, Non-Final Office Action issued Jul. 20, 2023.
Weiping Li, U.S. Appl. No. 17/568,293, Non-Final Office Action issued Jul. 17, 2023.
Weiping Li, U.S. Appl. No. 17/568,293, Final Office Action issued Dec. 30, 2023.
Yibu Semiconductor (Shanghai) Co., Ltd., First Office Action, CN 202011573447.X, Mar. 1, 2022, 11 pgs.
Yibu Semiconductor (Shanghai) Co., Ltd., Notice of reexamination, CN 202011573447.X, Apr. 18, 2023, 9 pgs.
Yibu Semiconductor (Shanghai) Co., Ltd., Search Report, TW 110147931, Jul. 19, 2022, 1 pg.
Yibu Semiconductor (Shanghai) Co., Ltd., First Office Action , TW 110147931, Jul. 19, 2022, 2 pgs.
Yibu Semiconductor (Shanghai) Co., Ltd., Second Office Action, TW 110147931, Oct. 17, 2022, 2 pgs.
Yibu Semiconductor (Shanghai) Co., Ltd., First Office Action, CN 202011559060.9, Jun. 30, 2023, 6 pgs.
Yibu Semiconductor (Shanghai) Co., Ltd., Search Report, TW 110147932, Nov. 18, 2022, 1 pg.
Yibu Semiconductor (Shanghai) Co., Ltd., First Office Action, TW 110147932, Nov. 18, 2022, 2 pgs.
Yibu Semiconductor (Shanghai) Co., Ltd., First Office Action, CN 202110062475.3, Jul. 8, 2023, 17 pgs.
Yibu Semiconductor (Shanghai) Co., Ltd., Notice of reexamination, CN 202110062475.3, Dec. 19, 2023, 13 pgs.
Yibu Semiconductor (Shanghai) Co., Ltd., Search Report, TW 111101834, Sep. 30, 2022, 1 pg.
Yibu Semiconductor (Shanghai) Co., Ltd., First Office Action, TW 111101834, Sep. 30, 2022, 33 pgs.
Yibu Semiconductor (Shanghai) Co., Ltd., First Office Action, CN 202110137354.0, Jun. 29, 2023, 8 pgs.

(56) References Cited

OTHER PUBLICATIONS

Yibu Semiconductor (Shanghai) Co., Ltd., First Office Action, TW 111102528, Aug. 5, 2022, 2 pgs.
Yibu Semiconductor (Shanghai) Co., Ltd., Search Report, TW 111102528, Aug. 5, 2022, 2 pgs.
Yibu Semiconductor (Shanghai) Co., Ltd., First Office Action, TW 111104536, Aug. 25, 2022, 11 pgs.
Yibu Semiconductor (Shanghai) Co., Ltd., Second Office Action, TW 111104536, Apr. 11, 2023, 10 pgs.
Weiping Li, U.S. Appl. No. 17/535,986, Response to Non-Final Office Action filed Oct. 20, 2023.
Weiping Li, U.S. Appl. No. 17/535,986, Notice of Allowance issued Feb. 13, 2024.
Weiping Li, U.S. Appl. No. 17/562,944, Non-Final Office Action, issued Apr. 11, 2024.

\* cited by examiner

600

S610
Providing at least one first-level device, at least one second-level device, and a carrier board, the at least one first-level device having first-level first surface formed with first-level interconnect bumps and opposing first-level second surface formed with first-level first alignment solder parts, the at least one second-level device having at least one second-level first surface formed with second-level interconnect bumps and second-level first alignment solder parts, the carrier board having first-level second alignment solder parts respectively corresponding to the first-level first alignment solder parts

S620
Placing the at least one first-level device on the carrier board such that the first-level first alignment solder parts are substantially aligned with respective ones of the first-level second alignment solder parts

S630
Forming alignment solder joints by soldering the first first-level alignment solder parts to respective ones of the first-level second alignment solder parts to align and fix the at least one first-level device to a side of the carrier board

S640
Encapsulating the at least one first-level device on the side of the carrier board in a molding compound for form a molded package body on the side of the carrier board

S650
Exposing the first-level interconnect bumps from the molded package body, thus obtaining a first-level assembly

FIG. 5A

SEMICONDUCTOR PACKAGING METHOD, SEMICONDUCTOR ASSEMBLY AND ELECTRONIC DEVICE COMPRISING SEMICONDUCTOR ASSEMBLY

CROSS REFERENCE TO RELATED APPLICATIONS

This application claims the benefit of priority under the Paris Convention to Chinese Patent Application No. CN202110198874.2, filed Feb. 22, 2021, entitled "Semiconductor Packaging Method, Semiconductor Assembly and Electronic Device Comprising Semiconductor Assembly," and is a continuation-in-part application of U.S. patent application Ser. No. 17/589,881, filed Jan. 31, 2022, which claims the benefit of priority under the Paris Convention to Chinese Patent Application No. CN202110137354.0, filed Feb. 1, 2021, entitled "Semiconductor Packaging Method, Semiconductor Assembly and Electronic Device Comprising Semiconductor Assembly," and which is a continuation-in-part application of U.S. patent application Ser. No. 17/562,939, filed Dec. 27, 2021, which claims the benefit of priority under the Paris Convention to Chinese Patent Application No. 202011559060.9, filed Dec. 25, 2020, entitled "Semiconductor Packaging Method, Semiconductor Assembly and Electronic Device Comprising Semiconductor Assembly," and Chinese Patent Application No. 202011573447.X, filed Dec. 25, 2020, entitled "Semiconductor Packaging Method, Semiconductor Assembly and Electronic Device Comprising Semiconductor Assembly," each of which is incorporated by reference herein in its entirety. This application is related to co-pending U.S. patent application Ser. No. 17/535,983, filed Nov. 26, 2021, U.S. patent application Ser. No. 17/535,986, filed Nov. 26, 2021, and U.S. patent application Ser. No. 17/562,944, entitled "Semiconductor Packaging Method, Semiconductor Assembly and Electronic Device Comprising Semiconductor Assembly," filed Dec. 27, 2021, each of which is incorporated by reference herein in its entirety.

FIELD OF THE INVENTION

The present application relates to the technical field of semiconductor manufacturing, in particular to a semiconductor packaging method, a semiconductor assembly and electronic device comprising the semiconductor assembly.

BACKGROUND

Semiconductor packages and systems that are compact, small, lightweight, and thin in design, while at the same time achieving high integration and versatility in function, are constantly being sought. Currently, various packaging technologies are proposed to meet the above-mentioned technical requirements, such as fan-out wafer level packaging, small chip packaging (chipset), heterogeneous integration, and 2.5-dimensional (2.5D) or three-dimensional (3D) packaging. These packaging techniques have different advantages and characteristics, but all present some technical challenges. Taking the existing fan-out package as an example, it faces many technical problems, such as warpage (warp), chip shift (die shift), surface flatness (topography), non-coplanarity between the chip and the molded package body (chip-to-mold non-planarity), package reliability (reliability), etc. Despite the continuing efforts in the industry to improve these technical problems by improving the equipment, materials, process elements, there is no economical and effective solution to some of the technical problems, especially problems such as warpage, chip drift, and surface coplanarity between different chips.

In addition, there are common techniques involved in the fabrication of various high-end semiconductor packages and systems, often involving the placement and attachment of semiconductor devices with high precision. This process step is usually performed by a high precision mounting (pick and place or the binder) equipment, which is very expensive. Still, the mounting speed is limited, resulting in low production speed, which becomes a bottleneck for the development and popularization of the technology.

The present application includes some embodiments directed to solving several of the core technical problems set forth above.

SUMMARY

Certain embodiments are directed to a novel semiconductor packaging method, semiconductor device and electronic device including the semiconductor device, which at least solve the above and other problems in existing semiconductor packaging technologies.

A semiconductor packaging method in accordance with some embodiments comprises forming a first-level assembly, including providing at least one first-level device, at least one second-level device, and a carrier board. In some embodiments, the at least one first-level device has at least one first-level first surface and at least one opposing first-level second surface, the at least one first-level first surface is formed with first-level interconnect terminals, the at least one first-level second surface is formed with first-level first alignment solder parts. In some embodiments, the at least one second-level device has at least one second-level first surface, and the second-level first surface is formed with second-level interconnect terminals and second-level first alignment solder parts. In some embodiments, the carrier board is formed with first-level second alignment solder parts respectively corresponding to the first-level first alignment solder parts.

In some embodiments, forming the first-level assembly further includes: placing the at least one first-level device on the carrier board such that the first alignment solder parts are substantially aligned with respective ones of the second alignment solder parts; and forming alignment solder joints by soldering the first alignment solder parts to respective ones of the second alignment solder parts to align and fix the at least one first-level device to one side of the carrier board.

In some embodiments, forming the first-level assembly further includes encapsulating the at least one first-level device on the side of the carrier board in a molding compound for form a molded package body on the side of the carrier board, and exposing the first-level interconnect terminals from the molded package body.

In some embodiments, forming the first-level assembly further includes sequentially forming an interconnect layer and interposer terminals corresponding to the second-level interconnect terminals on a side of the molded package body where the first-level first surface is exposed such that at least some of the first-level interconnect terminals are respectively electrically connected to the interposer terminals, through the interconnect layer; and forming second-level second alignment solder parts corresponding to the second-level first alignment solder parts, respectively, on the interconnect layer.

In some embodiments, after forming the first-level assembly, the packaging method further comprises: placing the at least one second-level device over the first-level assembly such that the second-level first alignment solder parts are substantially aligned with the second-level second alignment solder parts; forming second-level alignment solder joints by soldering the second-level first alignment solder parts and the second-level second alignment solder parts so that the at least one second-level device is aligned to the first-level assembly; pressing the at least one second-level device and the first-level assembly toward each other while the second-level alignment solder joints are at least partially melted to respectively join the second-level interconnect terminals and the interposer terminals to form interconnect joints; and releasing the pressing.

In some embodiments, the at least one first-level device and the at least one second-level device includes at least one of one or more semiconductor devices and an interconnect board, the interconnect board being a interposer or a substrate.

In some embodiments, at least one of the at least one first-level device and the at least one second-level device further includes a through electrode.

In some embodiments, a sum of heights of a second-level interconnect terminal and a corresponding interposer terminal is less than a sum of heights of a second-level first alignment solder part and a corresponding second-level second alignment solder part, such that the second-level interconnect terminals are spaced apart from the interposer terminals after the second-level first alignment solder parts and the second-level second alignment solder parts form second-level alignment solder joints.

In some embodiments, the semiconductor packaging method further comprises forming external interconnect terminals on the interconnect layer, wherein at least some of the first-level interconnect terminals and interposer terminals are respectively electrically connected to the external interconnect terminals through the interconnect layer. In some embodiments, the external interconnect terminals are spaced apart from the second level second alignment solder parts so as not to be covered by a perpendicular projection of the at least one second-level device on the interconnect layer after the at least one second-level device is aligned with the first-level assembly.

In some embodiments, respectively joining the second-level interconnect terminals and the interposer terminals to form interconnect joints includes, while the at least one second-level device is in alignment with the first-level assembly and the second-level alignment solder joints are still in an at least partially molten state, pressing the at least one second-level device and the first-level assembly toward each other.

In some embodiments, respectively joining the second-level interconnect terminals and the interposer terminals to form interconnect joints includes, after the at least one second-level device is in alignment with the first-level assembly, applying heat to melt the second-level alignment solder joints again and pressing the at least one second-level device and the first-level assembly toward each other when the second-level alignment solder joints are in a molten or partially molten state.

In some embodiments, the second-level interconnect terminals are interconnect bumps, and the interposer terminals are interposer bumps or interposer pads.

In some embodiments, the second-level interconnect terminals are interconnect pads and the interposer terminals are interposer bumps.

In some embodiments, the interconnect bumps are solder bumps and respectively joining the second-level interconnect terminals and the interposer terminals includes soldering the second-level interconnect terminals to respective ones of the interposer terminals to form interconnect joints.

In some embodiments, the interconnect bumps do not include solder and respectively joining the second-level interconnect terminals and the interposer terminals includes bonding the second-level interconnect terminals and respective ones of the interposer terminals by thermocompression bonding.

In some embodiments, forming the first-level assembly does not include forming the interconnect layer, and the second-level second alignment solder parts are pre-formed on a side of the first-level assembly, where the first-level first surface is exposed, and respectively correspond with the second-level first alignment solder parts. In such case, the packaging method further comprises, after forming the first-level assembly: placing the at least one second-level device on the first-level assembly such that the second-level first alignment solder parts are substantially aligned with second-level second alignment solder parts on the first-level assembly; forming second-level alignment solder joints by soldering the second-level first alignment solder parts and the second-level second alignment solder parts so that the at least one second-level device is precisely aligned to the first-level assembly; pressing the at least one second-level device and the first-level assembly toward each other while the second-level alignment solder joints are at least partially melted to respectively join the second-level interconnect bumps and the corresponding first-level interconnect terminals to form interconnect joints; and releasing the pressing.

In some embodiments, the second-level interconnect terminals include second-level interconnect bumps and the first-level interconnect terminals include first-level interconnect bumps. The second-level interconnect bumps are respectively joined with the first-level interconnect bumps by soldering the second-level interconnect bumps to respective ones of the first-level interconnect bumps.

In some embodiments, the second-level interconnect bumps are respectively joined with the first-level interconnect bumps by thermocompression bonding.

In some embodiments, the second-level interconnect bumps and the second-level first alignment solder parts together serve as second-level interconnect terminals on the second-level first surface of the at least one second-level device, the second-level interconnect terminals corresponding, respectively, with the first-level interconnect terminals on the at least one first-level device.

In some embodiments, in the case that the first-level assembly does not include the interconnect layer, the packaging method further comprises, after exposing the firs-level interconnect bumps from the molded package body and before placing the second-level device on the first-level assembly, forming the second-level alignment solder parts on a side of the first-level assembly where the first-level interconnect bumps are exposed.

Another aspect of the present application provides a semiconductor device packaged by the above semiconductor packaging method.

Yet another aspect of the present application provides an electronic device including the semiconductor device described above.

In some embodiments, above description is only an overview of the present application so that the technical solutions of the present application can be more clearly understood and implemented according to the contents of the specification. In order to make the aforementioned and other objects, features and advantages of the present application more comprehensible, embodiments of the present application are described in detail below.

BRIEF DESCRIPTION OF THE DRAWINGS

The present embodiments are illustrated by way of example and not limitation in the figures of the accompanying drawings, in which like references indicate similar elements.

FIGS. 5A-5B show a flow chart illustrating a packaging method according to some embodiments.

DETAILED DESCRIPTION OF THE EMBODIMENTS

Figure 1:
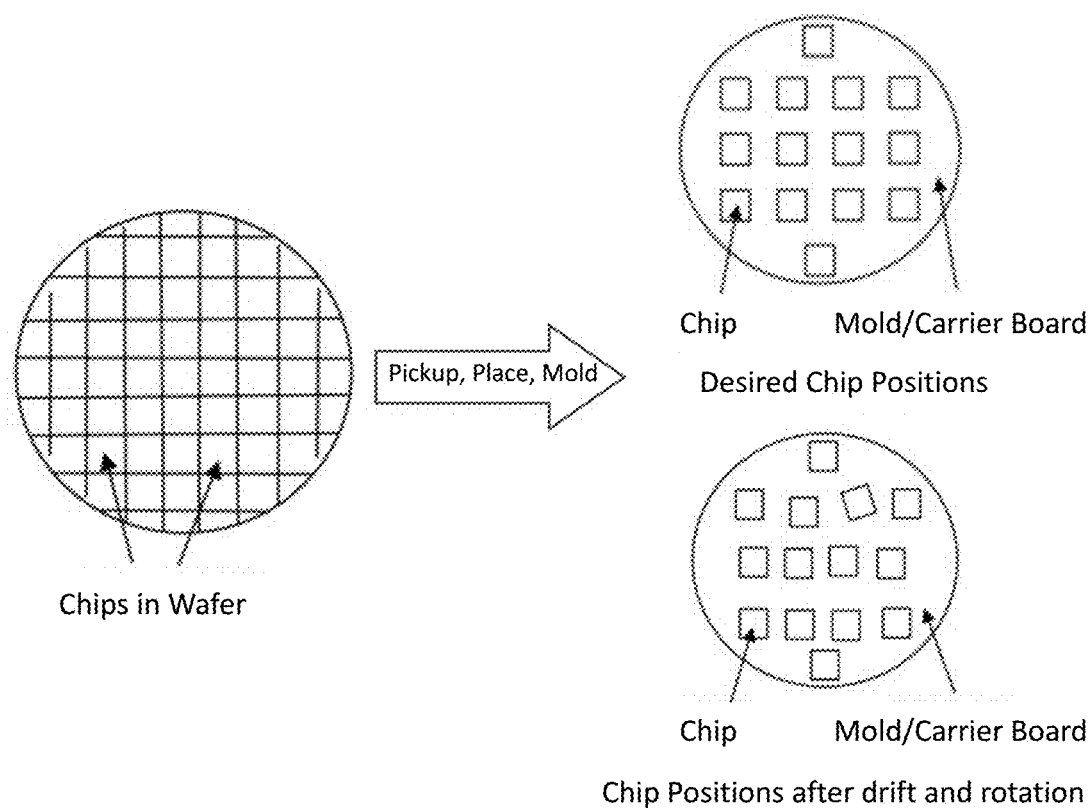
FIG. 1 is a schematic diagram illustrating a chip drift and a chip rotation phenomenon caused by a placement misalignment or a mold flow (mold flow) push during a chip-on-chip (chip-first) fan-out type package according to the related art.

The present application is intended in the following description to include at least one embodiment with reference to the accompanying drawings, in which like numerals represent the same or similar elements. Although the following description is based primarily on specific embodiments, it should be understood by those skilled in the art that the following description is intended to cover alternatives, modifications, and equivalents, which may be included within the spirit and scope of the present invention as defined by the appended claims and their equivalents, and as supported by the following description and drawings. In the following description, certain specific details are set forth, such as specific configurations, compositions, and processes, etc., to provide a thorough understanding of the present application. In other instances, well-known process and manufacturing techniques have not been described in detail to avoid unnecessarily obscuring the present application. Furthermore, the various embodiments shown in the figures are schematic representations and are not necessarily drawn to scale.

Semiconductor components (which may also be referred to as semiconductor packages) are a core component of modern electronic devices or products. Semiconductor components can be broadly classified in terms of device number and density into: discrete semiconductor devices, i.e., single chip devices, such as a single digital logic processor, diode, transistor; multi-chip components, such as a module of image sensors (CIS) and image processors (ASIC), a stack of a Central Processing Unit (CPU) and a dynamic memory (DRAM); and system level components, such as radio frequency Front End Modules (FEMs) in cell phones, display screen modules in cell phones and smart watches. Generally, the system-level package can include a wide variety of devices, including passive components (resistors, capacitors, inductors) and other devices or even components, in addition to semiconductor devices.

The semiconductor components herein may include active and passive devices including, but not limited to, active devices such as bipolar transistors, field effect transistors, integrated circuits, and passive devices such as chip resistors, capacitors, inductors, Integrated Passive Devices (IPDs), micro-electro-mechanical systems (MEMS), and the like. Various electrical connections are established between various active and passive devices to form circuits that enable the semiconductor assembly to perform high speed calculations and other useful functions.

Currently, semiconductor manufacturing typically involves two complex manufacturing processes, namely front-end wafer fabrication and back-end packaging, each of which may involve hundreds of steps. Previous wafer fabrication involves forming a plurality of chips (die) on the surface of the wafer. Each chip is generally identical and contains internally the circuits formed by the electrical connections of the active and/or passive elements. Subsequent packaging involves separating individual chips from the finished wafer and packaging them into semiconductor assemblies to provide electrical connections, structural support, and environmental isolation, while facilitating subsequent assembly of the electronic product.

An important goal of semiconductor manufacturing is to produce smaller semiconductor devices, packages, and assemblies. Smaller sizes, generally higher integration, less power consumption, higher performance, and smaller area/volume, are important to market performance of the final product. In one aspect, wafer fabrication can be improved to shrink chip sizes, increase circuit density and/or improve performance. In another aspect, subsequent packaging can be improved to further reduce the sizes, increase the density, and improve the performance of the semiconductor assembly by improving the packaging design, process and packaging material.

In the back-end packaging process, a novel and efficient packaging method is the so-called fan-out packaging. Fan-out packaging is a packaging technique that wraps single or multiple qualified chips (die) from a diced wafer with a molding compound and routes interconnect traces from the chip's interconnect pads to external solder balls via a redistribution layer (RDL) to achieve higher I/O density and flexible integration. The fan-out type package may be mainly classified as a chip-first type package or a chip-last type package. A chip-first type package can be classified as a face-down type or a face-up type.

The chip-first/face-down type packaging mainstream process comprises the following main steps: picking up chips from the cut wafer and placing the chips on a carrier board pasted with an adhesive film so that an first surface of the chips faces the adhesive film; encapsulating the chips using a molding compound; removing the carrier board (together with the adhesive film) to expose the active surface of the chip; forming an interconnect layer (including an RDL layer and Under Bump Metallization (UBM)) on an first surface of a chip; and forming solder balls on the interconnect layer. The interconnect pads or the interconnect bumps of the chips are electrically connected with the solder balls through the interconnect layer. The molded package body can be diced to form individual semiconductor elements.

The chip-first/face-up type packaging process and the chip-first/face-down type packaging process can be approximately the same, and the main difference is as follows: picking up a chip and placing the chip on a carrier board pasted with an adhesive film (the active surface of the chip is opposite to, or facing away from, the adhesive film); thinning the molded package body on the side of the active surface of the chip after encapsulation to expose the interconnect bumps on the active surface of the chip; forming an interconnect layer and solder balls over the active surface of the chip; and optionally removing the carrier board after the formation of the interconnect layer and the solder balls.

Figure 2:
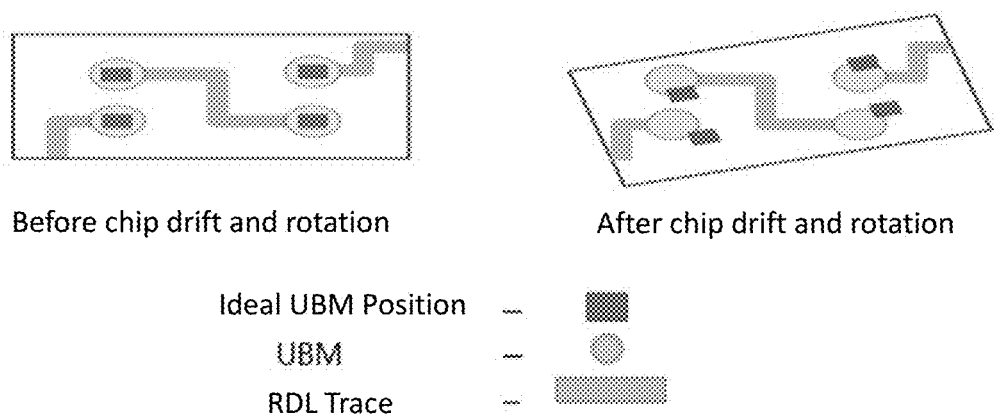
FIG. 2 shows a state diagram of Under Bump Metallization (UBM) and redistribution layer (RDL) trace position mismatch (or misalignment) formed after chip drift and rotation as shown in FIG. 1.

In the technical problem faced by the fan-out package at present, the high-precision placement and position fixing of the chip still lack an efficient and economical method. The higher the chip placement accuracy, the higher the equipment cost, the lower the production efficiency, and the more difficulty in breaking through the 0.5 micron limit of the chip mounting equipment. In addition, after a chip is placed on the adhesive film, which is used for bonding and fixing the chip, the flowing of the molding material can push the chip in the encapsulation process, so that the chip can be displaced and rotated on the adhesive film due to the deformability of the adhesive film. The higher temperatures used in the molding or encapsulation process further exacerbate this problem. Another source of chip displacement and rotation is internal stresses within the molded structure. Specifically, in the existing chip-first/face-up type packaging process, the encapsulation process comprises three stages: heating and injection molding, partial curing of a encapsulation material in high-temperature, and cooling, which are usually followed by a constant temperature heating step to fully cure the molding compound. The thermal expansion coefficients of the chip, the molding compound, the adhesive film, the carrier board, and the like are different, so the mismatch of the thermal expansion coefficients of various materials and the curing shrinkage of the molding compound in the encapsulation process cause uneven internal stress of the molding compound, which further causes the chip to drift and/or rotate (as shown in the chip arrangement at the lower right of FIG. 1) and warpage of the molded package body. Chip drift and/or rotation in turn causes positional mismatch or misalignment of subsequently formed RDL traces and UBMs (as shown in FIG. 2), which can result in a significant yield drop. The warpage of the molded package body causes difficulties in subsequent packaging processes including Under Bump Metallization (UBM) and redistribution line (RDL), and in severe cases even make it impossible to continue the process.

In addition, in the back-end packaging process, it may be necessary to further implement interconnection integration of a substrate (e.g., in a system-in-package), an interposer (e.g., in a 2.5D package), or another layer of chips (e.g., in a 3D package) in the Z-axis direction on the basis of two-dimensional integration of an X-Y plane (e.g., a plane parallel to an active surface or a passive surface of a chip) according to specific package specifications. At this time, similarly to the fan-out package described above, at least the high-precision placement and position fixing of the upper device on the lower device lacks an efficient and economical method. In addition, as for the interconnection between upper and lower devices in a 3D package (e.g., integrated fo (integrated fan out), CoWoS (chip on wafer on substrate), SoIC (system integrated chip)), a key technology that is currently mainstream is hybrid bonding (hybrid bonding). However, the hybrid bonding has many technical difficulties, and besides the common problems of high cost and low production efficiency, there are many other problems, such as that the Chemical Mechanical Polishing (CMP) is difficult to meet the strict requirement for pad dishing, the pad density difference of different areas on the chip affects the depth of the dishing, the pad (metal copper) is easy to oxidize at high temperature, and the chip is easy to be contaminated in the hybrid bonding of the chip and the wafer (die-to-wafer).

The present application aims to provide a novel and breakthrough packaging method that can at least solve the above technical problems.

A packaging method according to some embodiments utilizes self-alignment capability of first-level alignment solder joints between a first-level device (e.g., an interconnection board such as a substrate, or a transfer board such as an interposer, or a semiconductor device) and a carrier board when the solder joints are in a molten or partially molten state to automatically and precisely align the first-level device to a target position on the carrier board and to fix the position the first-level device after the solder is solidified. In some embodiments, first-level first alignment solder parts are pre-formed on a first-level second surface (i.e., the opposite surface of a first-level first surface with interconnect terminals, which can be interconnect or contact pad, or interconnect or contact bumps) of the first-level device, and corresponding first-level second alignment solder parts are formed on the carrier board. For example, one of a first-level first alignment solder part and a corresponding first-level second alignment solder part can be a solder bump, while the other of the first-level first alignment solder part and the corresponding first-level second alignment solder part can be a solder pad or solder bump. In some embodiments, after placing the first-level device at the target position on the carrier board by aligning the first-level first alignment solder parts and the first-level second alignment solder parts with each other, one (or both) of each respective first-level first alignment solder part and its corresponding first-level second alignment solder part are melted to form a respective alignment solder joint. At this point, if the first-level device is not precisely aligned to the target position on the carrier board (i.e., the first-level first alignment solder part and the corresponding first-level second alignment solder part were not precisely aligned), the alignment solder joint in a molten or partially molten (liquid or partially liquid) state should automatically and precisely guides the first-level device to the target position to achieve surface energy minimization according to the principle of minimum surface energy, and the fused alignment solder joint keeps the first-level device firmly fixed at the target position after solidification. The first-level first and second alignment solder parts are optimally designed (in such terms including but not limited to volume, geometry, composition, location, distribution, and number, etc.) to enable the accurate, efficient, and reliable self-alignment capability. Fixing the first-level device on the carrier board by adopting the soldering technique instead of the adhesive film bonding technique leads to many advantages. For example, any warping problem is improved, any possible drifting and rotating problems of the first-level device in subsequent encapsulation process are prevented by the firm soldering joints, placing deviation of a certain degree can be allowed when the first-level device is picked up and placed in view of the self-aligning capacity of the alignment solder joint, the requirement on the placing precision of the first-level device (especially for pick and place or die bonder) can be obviously reduced, the picking and placing operation speed of the semiconductor device can be obviously improved, the process efficiency is improved, and the process cost is reduced.

Secondly, according to the packaging method of some embodiments of the application, when the Z-axis direction interconnection integration of the second-level device (an interconnection board, e.g. a substrate or an interposer, or a semiconductor device) is carried out on the first-level assembly comprising the first-level device, the self-alignment capability of the second-level alignment solder joints between the first-level device and the second-level device in the state that the solder is at least partially melted is also utilized to automatically and accurately align the second-level device to the target position on the first-level assembly and achieve the position fixing and alignment of the second-level device after the solder is solidified. In some embodiments, second-level first alignment solder parts and corresponding second-level second alignment solder parts are pre-formed on the second-level first surface of the second-level device and the corresponding surface of the first-level assembly. For example, one of a second-level first alignment solder part and a corresponding second-level second alignment solder part is a second-level alignment solder bump and the other is a second-level alignment bond pad, or both are second-level alignment solder bumps. Similarly, a certain degree of placement deviation can be tolerated when picking and stacking the second-level device on the first-level assembly in view of the self-alignment capability of the second-level alignment solder joints, so that the requirement for second-level device placement accuracy (especially for pick and place or die binder) can be significantly reduced, and the speed of the second-level device picking and placing operation can be significantly increased, thereby further improving process efficiency and reducing process cost. In addition, by replacing hybrid bonding, the technical difficulties in hybrid bonding can be avoided, and simple, convenient, and efficient 3D packaging is realized.

As used herein, the term "semiconductor device" may refer to a chip (also interchangeably referred to as a die or integrated circuit) produced by a chip fabrication facility (fab), i.e., a chip that has not been packaged after wafer dicing and testing, and which may typically have only interconnect pads for external connection. The semiconductor device may also be a pre-processed (at least partially packaged) chip, such as a chip with interconnect bumps formed on the interconnect pads, or may have additional structures, such as stacked chips or packaged chips or semiconductor components, or the like.

The term "active surface" as used herein generally refers to a surface on a front side of a semiconductor device having a circuit function, including interconnect pads (or interconnect bumps formed on the interconnect pads) thereon, and may also be interchangeably referred to as a front surface or a functional surface. A surface having no circuit function on an opposing back side of the semiconductor device may be interchangeably referred to as a passive surface or a back surface, which is opposite to the active surface.

The term "interconnect terminal" as used herein generally refers to an interconnect pad or an interconnect bump on the active surface of a semiconductor device.

The term "alignment solder part" as used herein generally refers to a structure that may be aligned and soldered to a corresponding other alignment solder part for alignment by soldering methods known in the art.

Figure 3A:
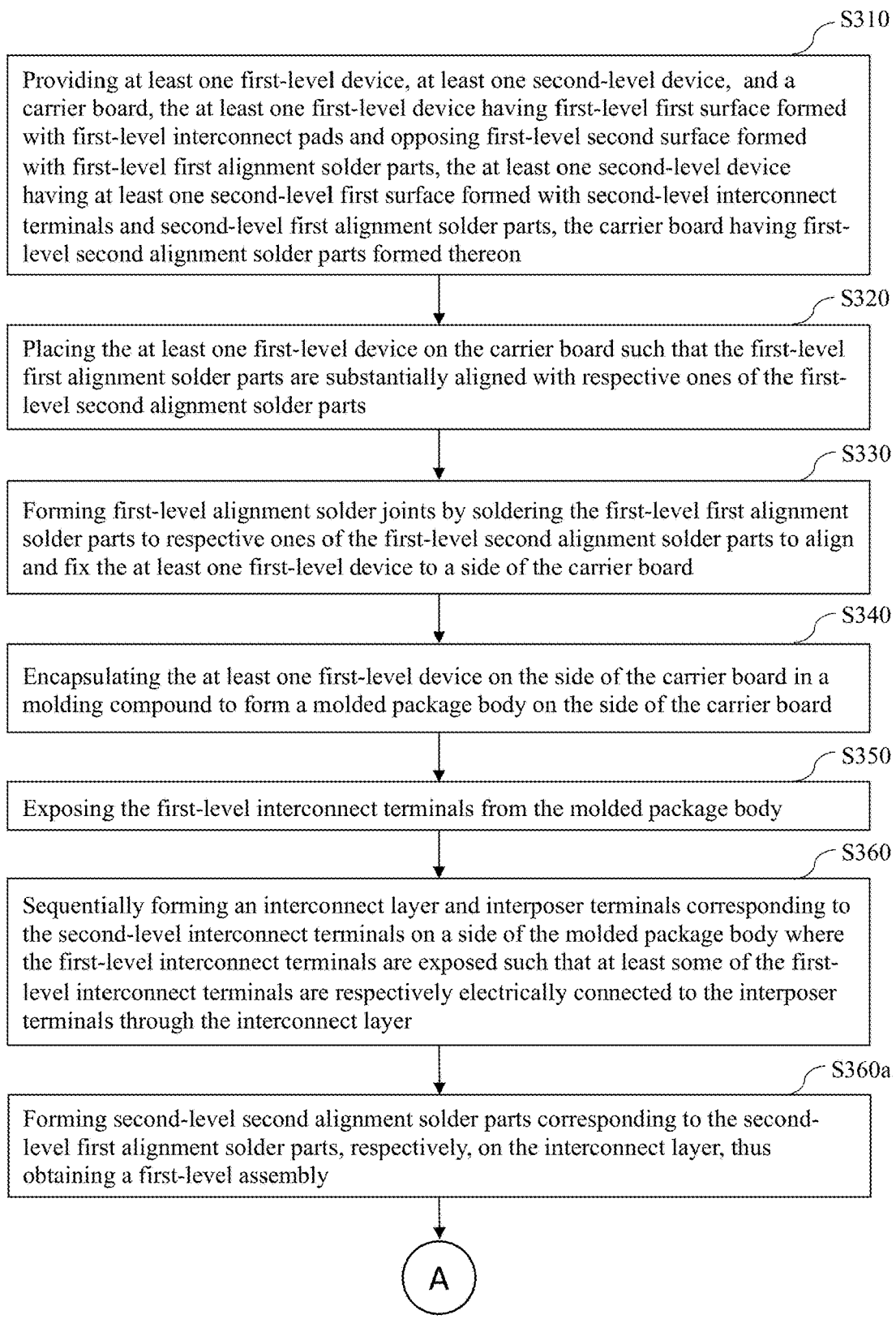
FIGS. 3A-3B show a flow chart illustrating a packaging method according to some embodiments.
Figure 3B:
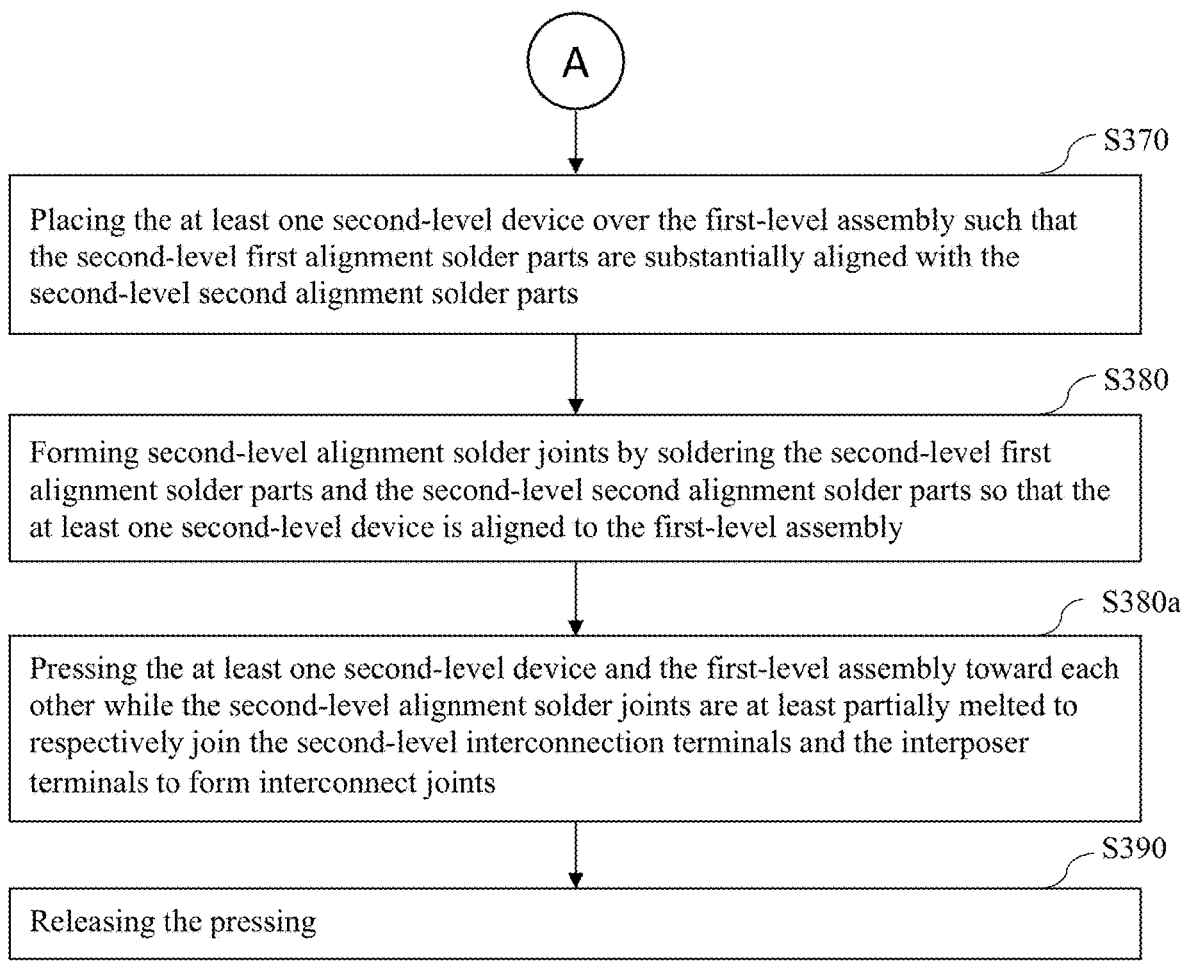

FIGS. 3A-3B show a schematic flow diagram of a packaging method 300 according to an embodiment of the present application. As shown, the packaging method 300 includes steps S310-S390, as described below.

S310—providing at least one first-level (or first-stage) device, at least one second-level (or second-stage) device, and a carrier board. In some embodiments, the at least one first-level device has at least one first-level first surface and at least one first-level second surface opposite to each other, the at least one first-level first surface is formed with first-level interconnect terminals thereon, the at least one first-level second surface is formed with first-level first alignment solder parts thereon. In some embodiments, the at least one second-level device has at least one second-level first surface and at least one second-level second surface opposite to each other, the at least one second-level first surface is formed with second-level interconnect terminals and second-level first alignment solder parts thereon. The carrier board is formed with first-level second alignment solder parts respectively corresponding to the first-level first alignment solder parts.

In some embodiments, the at least one first-level device includes a plurality of first-level devices. As an example, the plurality of first-level devices may include semiconductor devices that are at least partially different from each other in function, size, or shape, or may be the same as each other. In some embodiments, the at least one second-level device includes a plurality of second-level devices. As an example, the plurality of second-level devices may include semiconductor devices that are at least partially different from each other in function, size, or shape, or may be the same as each other. In some embodiments, the type and specific number of the first-level devices and the second-level device may be appropriately selected according to specific process conditions or actual requirements (for example, the size and shape of the carrier board, the placement pitch of the first-level devices and the second-level devices, package size and shape, manufacturing process specifications, functional design of semiconductor assemblies, etc.), and the present application is not particularly limited thereto.

In some embodiments, the carrier board or carrier is a glass carrier, a ceramic carrier, a metal carrier, an organic polymer material carrier, or a silicon wafer, or a combination of two or more of the above materials or the like. Optionally, the carrier board has an interconnect structure or a product function, e.g., an interconnect board or interposer, which is a substrate (such as a package substrate) or an interposer, and which is used as the carrier board. For example, the interposer provides horizontal and/or vertical interconnections between devices attached thereto. As an example, the first-level second alignment solder parts can act as interconnect terminals of the interconnect board.

In some embodiments, the at least one first-level device includes at least one first-level semiconductor device, the first-level interconnect terminals are first-level interconnect pads or bumps formed on at least one active side or active surface of the at least one first-level semiconductor device, and the first-level first alignment solder parts are formed on at least one passive surface of the at least one first-level semiconductor device. In other embodiments, the at least one first-level device includes an interconnect board, which, for example, is a substrate (e.g., a package substrate) or interposer that, for example provides horizontal and/or vertical interconnections.

In some embodiments, either one of a first-level first alignment solder part and a corresponding first-level second alignment solder part is an alignment solder bump and the other is an alignment pad corresponding to the alignment solder bump. In other embodiments, the first-level first alignment solder part and the corresponding first-level second alignment solder part are both alignment solder bumps, and the melting points of the first-level first alignment solder part and the first-level second alignment solder part can be the same or different. As an example, the first-level alignment solder bumps may be prefabricated on a first-level device (e.g., a wafer) or a carrier using a bumping process (e.g., electroplating, ball-planting, stencil printing, evaporation/sputtering, etc.) known in the art. As an example, the first-level alignment solder parts may be fabricated on the first-level device or the carrier board in advance using a deposition (e.g., metal layer)-photolithography-etching process. In some embodiments, any other alignment solder part configuration or form may be used as long as the first-level first and second alignment solder parts are capable of being soldered to each other for alignment purposes.

In some embodiments, the first-level first alignment solder parts and the first-level second alignment solder parts correspond respectively to each other in volume, size, geometry, composition, distribution, location, and number, so that the first-level device(s) can be precisely aligned to the respective target position(s) on the carrier board by soldering the first-level first alignment solder parts respectively to the first-level second alignment solder parts.

In some embodiments, the specific volume, size, geometry, composition, distribution, location and number of the first-level first alignment solder parts and/or the first-level second alignment solder parts may be appropriately selected according to specific process conditions or actual requirements (for example, the size and shape of the carrier board and the first-level device, the placement pitch or package size and shape of the first-level device, etc.), and the present application is not particularly limited thereto. For example, the first-level first alignment solder parts may be formed in substantially the same volume, size, geometry, or composition for all first-level devices regardless of whether functions, sizes or shapes are identical to each other, and the first-level second alignment solder parts on the carrier board may be formed in substantially the same volume, size, geometry or composition, so as to reduce the complexity of subsequent processes and improve the packaging efficiency. For another example, for first-level devices with different functions, sizes or shapes, the first-level first alignment solder parts and the first-level second alignment solder parts may be formed with different volumes, sizes, geometries or compositions so that different bond pad heights may be formed after subsequent bonding to achieve a particular function or to meet a particular requirement. In some embodiments, for a plurality of first-level devices, the first-level first alignment solder parts and/or the first-level second alignment solder parts are configured to enable first surfaces of the plurality of first-level devices to lie in a same plane parallel to a surface of the first carrier board after subsequent formation of first-level first alignment solder bonds or joints. For another example, each of the first-level devices may have at least three first-level first alignment solder parts formed thereon that are substantially regularly distributed so as to enable a first-level second surface of a first-level device to be securely and stably held in a plane substantially parallel to the carrier board by the soldering of the first-level first alignment solder parts and the first-level second alignment solder parts. For another example, the first-level first alignment solder parts may be formed on each of the first-level devices in a region on the first-level second surface proximate to the edge thereof so as not to interfere with subsequent processes and product applications.

In some embodiments, the first-level interconnect terminals have the form of interconnect bumps. By way of example, the interconnect bumps may be pre-formed on the interconnect pads of the first level device using a bumping process known in the art (e.g., electroplating, ball-planting, stencil printing, evaporation/sputtering, etc.). For example, the interconnect bumps may be in the form of a conductive pillar. In an alternative embodiment, the first-level interconnect terminals have the form of interconnect pads.

Optionally, the first-level device is further provided with at least one through electrode for vertical interconnection. For example, for the first-level semiconductor device, the through via is a Through Silicon Via (TSV). As another example, for the interposer, the through via is a TSV or a Through Glass Via (TGV). As another example, the through electrode may be a Plated Through Hole (PTH) or a via (via) in the substrate. In some embodiments, at this time, the first-level device may be further formed with other interconnect terminals (for example, the first-level first alignment solder parts may be part thereof) on a first-level second surface opposite to the first-level first surface, and one end of the at least one through electrode is electrically connected to at least a part of the first-level interconnect terminals, respectively, and the other end of the at least one through electrode is electrically connected to a respective one of the other interconnect terminals.

In some embodiments, the second-level device is a second-level semiconductor device, and the second-level interconnect terminals and the second-level first alignment solder parts are formed on an active surface of the second-level semiconductor device. In other embodiments, the second-level device is an interconnect board. As an example, the interconnect board is a substrate (such as a package substrate) or an interposer that, for example, provides horizontal and/or vertical interconnections.

As an illustrative embodiment, at least one of the at least one first-level device and the at least one second-level device comprises at least one semiconductor device.

In some embodiments, each second-level first alignment solder part is a second-level alignment solder bump or second-level alignment pad. As an example, second-level alignment solder bumps may be prefabricated on a second-level device using a bumping process (e.g., electroplating, ball-planting, stencil printing, evaporation/sputtering, etc.) known in the art. As an example, the second-level alignment solder parts may be fabricated on the second-level device in advance using a deposition (e.g., metal layer)-photolithography-etching process.

In some embodiments, the specific volume, size, geometry, composition, distribution, location and number of the second-level first alignment solder parts may be appropriately selected according to specific process conditions or actual requirements (for example, the size and shape of the first-level device(s) and the second-level device(s), the placement pitch or package size and shape of the first-level device(s) and the second-level device, etc.), and the present application is not particularly limited thereto. For example, for multiple second level devices, the second-level first alignment solder parts may be formed in substantially the same volume, size, geometry or composition for the second-level devices regardless of whether functions, sizes or shapes of the multiple second-level devices are identical to each other, so as to reduce the complexity of subsequent processes and improve the packaging efficiency. For another example, for multiple second-level devices with different functions, sizes or shapes, the second-level first alignment solder parts and the second-level second alignment solder parts may be formed with different volumes, sizes, geometries or compositions so that different solder joint heights may be formed after subsequent bonding to achieve a particular function or to meet a particular requirement. As another example, each of the second-level devices may have at least three second-level first alignment solder parts formed thereon, which are substantially regularly distributed, so that the second-level first surface of the second-level device can be securely and stably held in a plane substantially parallel to the carrier board by the second-level alignment solder joints formed by the later-described soldering process. In some embodiments, the second-level first alignment solder parts can be distributed along an edge sufficiently far from the second-level interconnect terminals on each of the second-level devices so as not to interfere with subsequent processes and product applications.

In some embodiments, the second-level interconnect terminals are second-level interconnect bumps, which, for example, can be pre-formed on interconnect pads of the second-level device(s) using a bumping process known in the art (e.g., electroplating, ball-planting, stencil printing, evaporation/sputtering, etc.). For example, a second-level interconnect bump may be in the form of a conductive pillar. Alternatively, the second-level interconnect terminals are second-level interconnect pads. Optionally, the second-level device is further provided with at least one through electrode for vertical interconnection. For example, for the second-level semiconductor device, the through via is a Through Silicon Via (TSV). As another example, for the interposer, the through via is a TSV or a Through Glass Via (TGV). As another example, the through electrode may be a Plated Through Hole (PTH) or a via (via) in the substrate. In some embodiments, at this time, the second-level device may be further formed with other interconnect terminals on a second-level second surface opposite to the second-level first surface, and one end of the at least one through electrode is electrically connected to at least one of the second-level interconnect terminals, respectively, and the other end of the at least one through electrode is electrically connected to one of the other interconnect terminals, respectively.

Figure 4A:
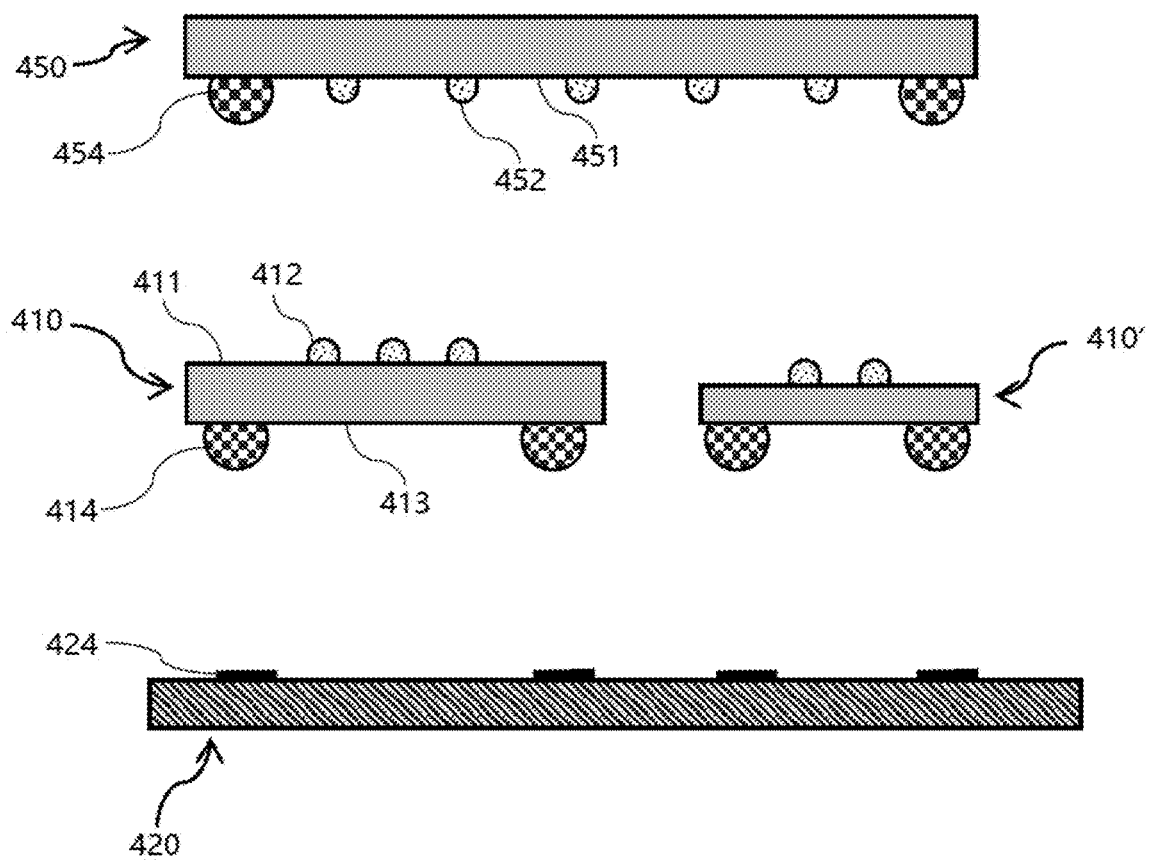
FIG. 4A to 4K show cross-sectional views for schematically illustrating a packaging method and a package according to some embodiments.

In some embodiments, as shown in FIG. 4A, a plurality of first-level devices 410, at least one second-level device 450, and a carrier board 420 are provided. At least two of the first-level devices 410, 410' are different, e.g., different in size and/or function, among the plurality of first-level devices. It is to be appreciated that although only the reference numerals of the relevant portions of the first-level semiconductor device 410 are shown in FIG. 4A (and FIGS. 4B to 4K described below) for ease of illustration and the description below is made in conjunction therewith, the description applies equally to the corresponding similar portions of the first-level semiconductor device 410'. First-level interconnect bumps 412 are formed and distributed on the first (active) surfaces 411 of the first-level devices 410 (and/or 410') and first-level alignment solder bumps 414 are formed on the second (passive) surfaces 413. The second-level semiconductor devices 450 are formed with second-level interconnect bumps 452 and second-level first alignment solder bumps 454 distributed over the active surface 451. First-level alignment pads 424 are formed on a surface of the carrier board 420 in corresponding positions as the first-level alignment bumps 414 the first-level devices 410, 410'.

S320—placing the at least one first-level device on the carrier board such that the first-level first alignment solder parts are substantially aligned with the first-level second alignment solder parts.

In some embodiments, "substantial alignment" may mean each first-level first alignment solder part and the corresponding first-level second alignment solder part contacting each other, respectively, without being precisely centered in a direction perpendicular to the second surface. Here, "centered" is generally meant that the centers of the corresponding first and first-level second alignment solder bumps are aligned in a direction perpendicular to the active or second surface. It should be noted that "substantial alignment" of a first-level first alignment solder part with the corresponding first-level second alignment solder part means that there is at least contact between the first-level first alignment solder part and the corresponding first-level second alignment solder part to the extent that self-alignment is possible by virtue of the principle of minimum surface energy of the alignment solder parts in a molten or partially molten state during soldering, as described below, and thus "substantial alignment" includes a state of imprecise alignment but at least physical contact, but may not exclude a state of exact alignment.

In some embodiments, when the first-level device is placed on the carrier board in step S320, the second surface of the first-level device faces the carrier board (i.e., the surface on which the first-level first alignment solder part is formed), and the first surface of the first-level device faces away from the carrier board.

Figure 4B:
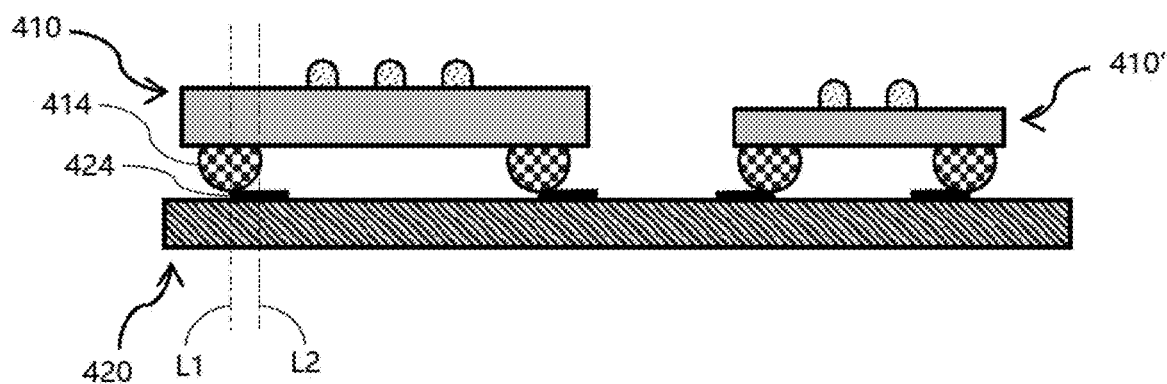

In some embodiments, as shown in FIG. 4B, first-level device 410 (and/or 410') is placed on carrier board 420 such that alignment solder bumps 414 are in contact with corresponding alignment pads 424. At this time, alignment solder bump 414 may be somewhat misaligned with alignment pad 424, i.e., the vertical centerline L1 of alignment solder bump 414 and the vertical centerline L2 of alignment pad 424 are not coincident.

S330—forming alignment solder joints by soldering the first-level first alignment solder parts to respective ones of the first-level second alignment solder parts so that the at least one first-level device is precisely aligned and fixed to the carrier board.

In some embodiments, "precise alignment" indicates a state where a deviation between an actual position and a target position of the first-level device on the carrier board is within a tolerance in the art or a preset tolerance. In some embodiments, precise alignment is achieved using the principle of minimum surface energy exhibited by the solder joint or bonds formed by soldering corresponding first-level first and second alignment solder parts in a molten or partially molten state during soldering. In particular, when the first-level first alignment solder part and the first-level second alignment solder part are in contact with each other but are not precisely centered in a direction perpendicular to the second surface of the first-level device or the carrier board, in the soldering process, one of the first-level first alignment solder part and the first-level second alignment solder part, which can be an alignment solder bump, is melted or partially melted and infiltrates the other one of the first-level first alignment solder part and the first-level second alignment solder part, which can be an alignment solder pad or another alignment solder bump, or both the first and second alignment solder parts melt or partially melt as alignment solder bumps, thereby forming an alignment solder joint in a molten or partially molten state. In some embodiments, the alignment solder part in the molten or partially molten state tends to reshape itself based on a minimum surface energy principle to bring the first-level first alignment solder part and the first-level second alignment solder part closer to a centered state, thereby driving the first-level device which is lighter relative to the carrier board toward its target position to be accurately aligned with the carrier board.

In some embodiments, after the first-level first alignment solder part and the first-level second alignment solder part are bonded to form a solder joint, the second surface of the first-level device and the carrier board are spaced apart to form a space therebetween due to the height of the alignment solder joint itself (in a direction perpendicular to the second surface of the first-level device or the carrier board) formed thereby.

In some embodiments, each alignment solder bump includes solder, and soldering may be performed by various means known in the art for melting solder, including but not limited to reflow soldering, laser soldering, high frequency soldering, infrared soldering, and the like. By way of example, soldering may be performed using a flux or a solder paste.

Figure 4C:
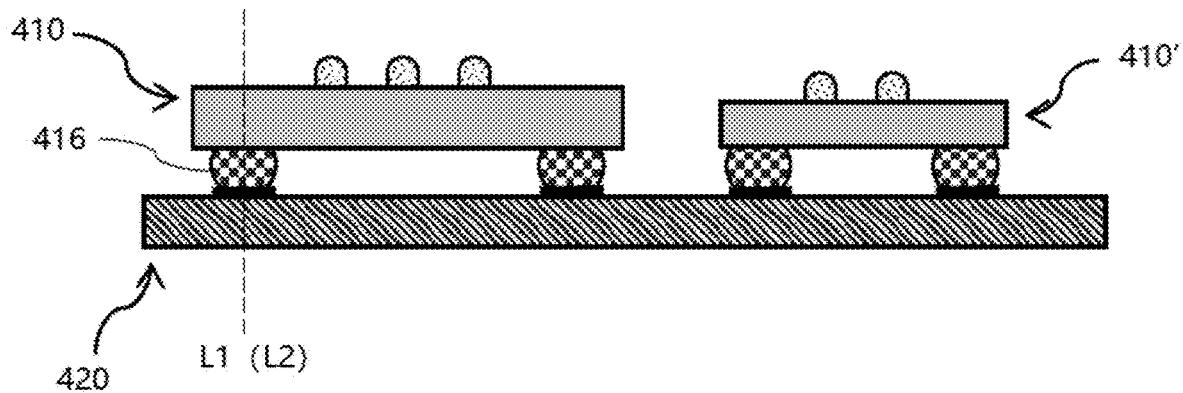

In some embodiments, alignment solder bumps 414 and alignment solder pads 424 are bonded to form alignment solder joints 416, as shown in FIG. 4C. During the soldering process, an alignment solder bump 414 in a molten state wets the corresponding alignment pad 424 and self-aligns with the alignment pad 424 (i.e., the vertical center line L1 of the alignment solder bump 414 coincides with the vertical center line L2 of the alignment pad 424) based on its minimum surface energy principle, so that the first-level device 410 (and/or 410') is brought into alignment with the first carrier board 420. After the soldering is completed, the second surface 413 of the first-level device 410 (and/or 410') is spaced apart from the first carrier board 420 to form a space therebetween.

In some embodiments, after S330, the packaging method 300 further comprises: turning over the first-level device and the carrier board together as a whole to enable the first surface of the first-level device to face downward (e.g., toward the earth), and the alignment solder joints are melted or partially melted again and then cooled to solidify the alignment solder joints. In some embodiments, the alignment solder joints, which are re-melted or partially melted at this time, are moderately elongated by the weight of the first-level device, whereby the self-alignment accuracy can be further improved. It should be noted that the first-level device will not fall off the carrier board due to its own weight because of the surface energy of the alignment solder in the molten state or the partially molten state. As an alternative embodiment, in S310, viscous flux is pre-coated on the first-level first and/or second alignment solder parts, and S330 includes: before the soldering is performed, turning over the first-level device and the carrier board together as a whole so that the first surface of the first-level device faces downward (toward the earth). In some embodiments, the alignment solder joints, which are melted or partially melted during soldering, are moderately elongated by the weight of the first-level device after being flipped, whereby the self-alignment accuracy can be further improved. It should be noted that, since the viscous flux adheres the first-level device to the carrier, the first-level device would not fall off from the carrier due to its own weight after being turned over. In some embodiments, before S340 described below, the first-level device and the carrier board together as a whole need to be flipped again.

In some embodiments, when the first-level device includes multiple first-level devices, S330 includes a leveling process to level the first surfaces of the first-level devices using a leveling plate when the first-level devices are precisely aligned with the carrier board and the alignment solder joints are still in a molten or partially molten state. In some embodiments, a flattening or leveling process is carried out on the first-level first surfaces of the first-level devices by utilizing a flattening board (leveling plate), so that the first-level first surfaces of the first-level devices are leveled with respect to each other to be basically positioned in a same plane parallel to the carrier board. As an example, the leveling process includes: placing the leveling plate over the first surfaces of the first-level devices; pressing the leveling plate toward the carrier board such that the first surfaces of the plurality of first-level devices lie substantially in a same plane parallel to the carrier board; while maintaining the pressing, cooling to substantially solidify the alignment solder joints; and removing the leveling plate. As an alternative embodiment, when the at least one first-level device includes a plurality of first-level devices, after S330, the packaging method 300 further comprises performing a leveling process, including: melting or partially melting the alignment solder joints again, leveling the first surfaces of the plurality of first-level devices using a leveling plate so that the first surfaces of the plurality of first-level devices are basically positioned in a same plane parallel to the carrier board. As an example, the leveling process includes: melting or partially melting the alignment solder joints again; placing the leveling plate over the first surfaces of the plurality of first-level devices; pressing the leveling plate toward the carrier board such that the first surfaces of the plurality of first-level devices lie substantially in a same plane parallel to the carrier board; while maintaining the pressing, cooling the assembly to substantially solidify the alignment solder joints; and removing the leveling plate. In some embodiments, since the leveling plate is not removed until the alignment solder joint has substantially solidified, the surface energy of the molten pad is prevented from restoring the first-level device to its original height prior to the leveling plate.

Figure 4D:
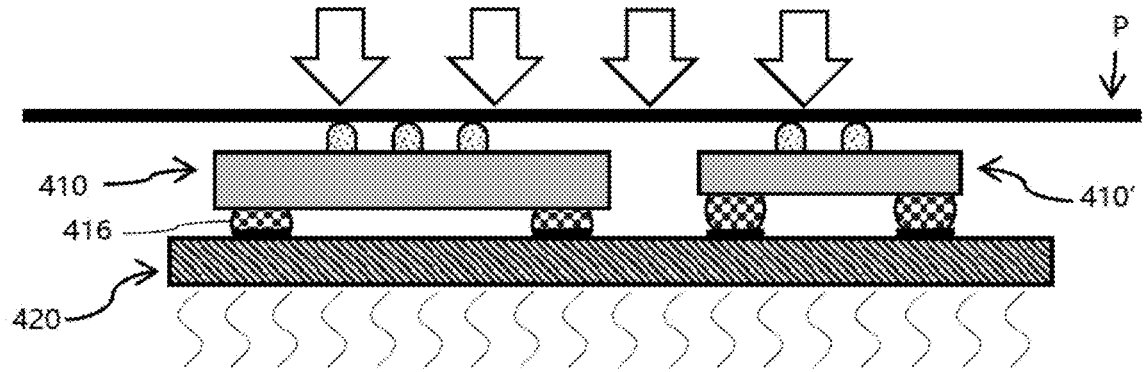

In some embodiments, as shown in FIG. 4D, after the alignment solder joints 416 are again brought into a molten or partially molten state by heating, and after the leveling plate P is placed on the first surfaces 411 of the plurality of first-level devices 410 (and/or 410'), the leveling plate P is pressed (i.e., toward the carrier board 420) to perform a pressing or leveling process to keep the first surfaces of the plurality of first-level devices 410, 410' in the same plane parallel to the carrier board 420 while he alignment solder joints 416 are solidifying. The temperature is decreased while the pressing is maintained to solidify the alignment solder joints 416, and then the leveling plate P is removed.

Thus, the first surfaces of all first-level devices can be flush (accurately leveled and positioned at the same height from the carrier board). In some embodiments, a suitable pressure needs to be applied to the leveling plate such that the alignment solder joints in the molten or partially molten state are suitably deformed and the resulting vertical (with respect to the first-level first surface of the first-level device or the first carrier board) displacement of the leveling plate is suitable to prevent damage to the first-level device. As an example, a solder trap is formed in advance around each first-level second alignment solder part of the carrier board, thereby preventing uncontrolled random flow of excess molten solder during the leveling process.

In some embodiments, the leveling process using a leveling plate described above is combined with the solder process or the remelting process after the inversion described above. As an example, the leveling process to level the first surfaces of the first-level devices using a leveling plate when the first-level devices are precisely aligned with the carrier board and the alignment solder joints are still in a molten or partially molten state is performed in S330 after turning over the first-level device and the carrier board together as a whole is performed, or the leveling process including melting or partially melting the alignment solder joints again and leveling the first surfaces of the plurality of first-level devices using a leveling plate is performed after S330 including turning over the first-level device and the carrier board together as a whole is performed, or turning over the first-level device and the carrier board together as a whole and remelting and then solidifying the first-level alignment solder joints are performed after the leveling process is performed, or a leveling process is performed when the first-level device and the carrier board together as a whole is turned over, and the alignment solder joints are melted or partially melded and then cooled again to solidify the alignment solder joints.

S340—encapsulating the at least one first-level device on one side of the carrier board in a molding compound for form a molded package body on the side of the carrier board.

In some embodiments, not only the first surface and the side surfaces of the first-level device are encapsulated, but the space between the second surface of the first-level device and the carrier board is also filled with the molding compound.

In some embodiments, the encapsulation is performed using a molding compound of a resinous material (e.g., epoxy).

In some embodiments, the encapsulation is performed using a molding process such as injection molding, printing, and optionally in combination with an underfill process.

Figure 4E:
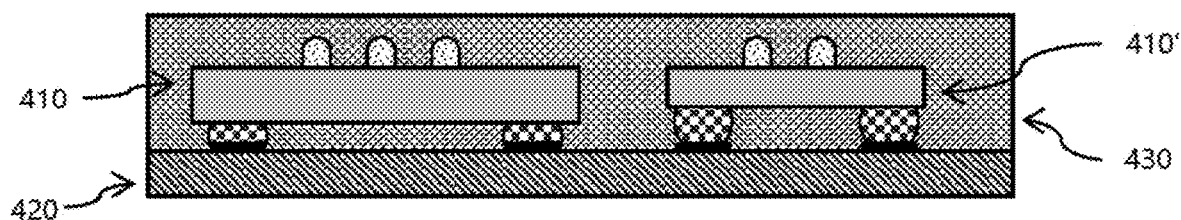

In some embodiments, as shown in FIG. 4E, encapsulation is performed on the side of the carrier plate 420 to which the first-level semiconductor devices 410, 410' are fixed. Thus, the molding compound 430 encapsulates all surfaces of the first level semiconductor devices 410, 410', including the active surfaces 411 (including the first level interconnect bumps 412), the passive surface 413, and the side surfaces. Optionally, the space between the passive surfaces 413 of the first level semiconductor device 410, 410' and the carrier plate 420 is filled using an underfill process S350—exposing the first-level interconnect terminals from the molded package body.

In some embodiments, when the first level interconnect terminals have the form of interconnect bumps, the interconnect bumps are exposed by thinning (e.g., grinding, etching, or ablating, etc.) the molding package body. In some embodiments, at this point, portions near the top ends of the interconnect bumps may be removed during the thinning.

In some embodiments, when the first-level interconnect terminals have the form of interconnect pads, the interconnect pads are exposed by forming openings on the molding package body. By way of example, the openings may be formed using laser ablation (e.g., laser drilling). By way of example, the openings may be formed by mechanical drilling. As an example, prior to forming the openings, the molded package body may be thinned to meet product design requirements and/or to facilitate the forming of the openings.

Figure 4F:
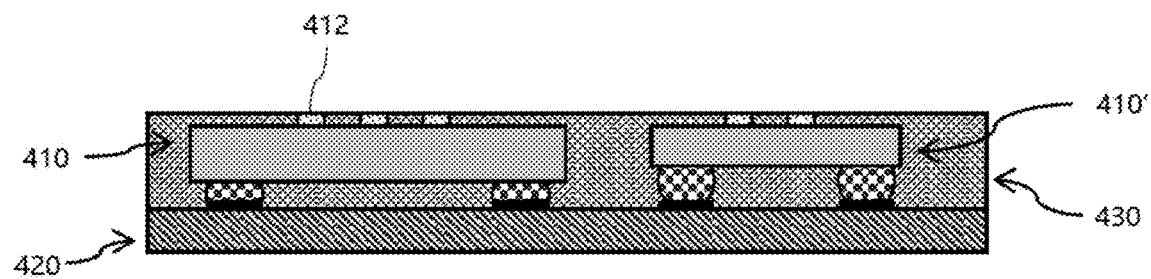

In some embodiments, as shown in FIG. 4F, the side of the molded package body 430 near the active surface 411 (or the first level interconnect bumps 412) is thinned until the first level interconnect bumps 412 are exposed. Top portions of the interconnect bumps 412 may be removed during thinning.

S360—sequentially forming an interconnect layer and interposer terminals corresponding to the second-level interconnect terminals on a side of the molded package body where the first-level interconnect terminals are exposed such that at least some of the first-level interconnect terminals are electrically connected to the interposer terminals, respectively, through the interconnect layer.

Figure 4G:
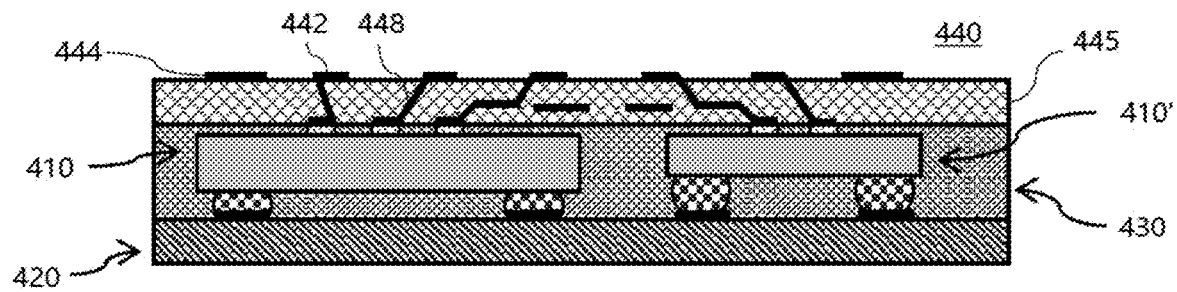
Figure 4G:
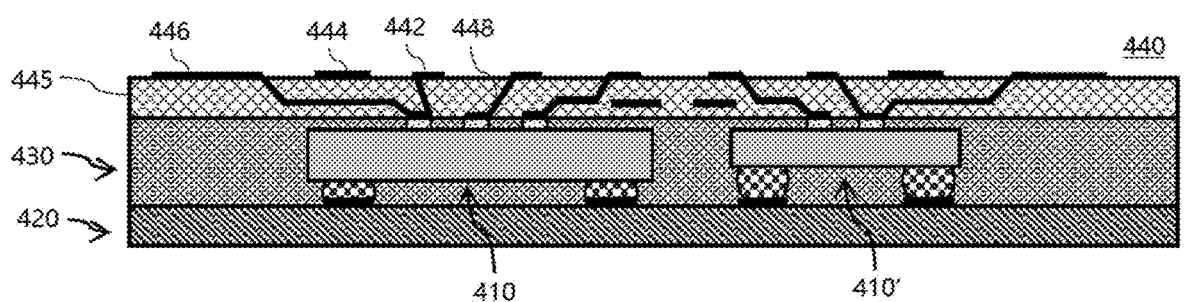

S360a—forming second-level second alignment solder parts corresponding to the second-level first alignment solder parts, respectively, on the interconnect layer, resulting in a first-level assembly, as shown in FIG. 4G and discussed further below.

In some embodiments, the interconnect layer includes a redistribution layer (RDL) to realize conductive connection of the first-level interconnect terminals with the interposer terminals. In some embodiments, the interconnect layer further includes an insulating layer for achieving electrical insulation between the conductive paths, and the specific number and material of the insulating layer may be appropriately selected according to specific process conditions or needs, which is not particularly limited in the present application.

In some embodiments, either one of a second-level first alignment solder part and a corresponding second-level second alignment solder part is an alignment solder bump and the other is an alignment pad corresponding to the alignment solder bump. In other embodiments, the second-level first alignment solder part and the corresponding second-level second alignment solder part are both alignment solder bumps, and the melting points of the second-level first alignment solder part and the second-level second alignment solder part can be the same or different. As an example, the second-level alignment solder bumps may be prefabricated on a second-level device (e.g., a wafer) or a carrier using a bumping process (e.g., electroplating, ball-planting, stencil printing, evaporation/sputtering, etc.) known in the art. As an example, the second-level alignment solder parts may be fabricated on the second-level device or the carrier board in advance using a deposition (e.g., metal layer)-photolithography-etching process. In some embodiments, any other solder part configuration or form may be used as long as the second-level first and second alignment solder parts are capable of being soldered to each other for alignment purposes.

In some embodiments, the second-level first alignment solder parts and the second-level second alignment solder parts correspond respectively to each other in volume, size, geometry, composition, distribution, location, and number, so that the second-level device(s) can be precisely aligned to the respective target position(s) on the carrier board by soldering to the second-level first alignment solder parts respectively to the second-level second alignment solder parts.

In some embodiments, the specific volume, size, geometry, composition, distribution, location and number of the second-level first alignment solder parts and/or the second-level second alignment solder parts may be appropriately selected according to specific process conditions or actual requirements (for example, the size and shape of the carrier board and the second-level device, the placement pitch or package size and shape of the second-level device, etc.), and the present application is not particularly limited thereto. For example, the second-level first alignment solder parts may be formed in substantially the same volume, size, geometry, or composition for all second-level devices regardless of whether functions, sizes or shapes are identical to each other, so as to reduce the complexity of subsequent processes and improve the packaging efficiency. For another example, for second-level devices with different functions, sizes or shapes, the second-level first alignment solder parts and the second-level second alignment solder parts may be formed with different volumes, sizes, geometries or compositions so that different bond pad heights may be formed after subsequent bonding to achieve a particular function or to meet a particular requirement.

In some embodiments, the second-level interconnect terminals are second-level interconnect bumps, and the interposer terminals are interposer bumps or interposer pads. In other embodiments, the second-level interconnect terminals are second-level interconnect pads, and the interposer terminals are interposer bumps. By way of example, the interposer bumps may be formed by a bump forming process known in the art (e.g., electroplating, ball-planting, stencil printing, evaporation/sputtering, etc.), and the interposer pad may be formed by a deposition-lithography-etching process (e.g., metal layer) known in the art, which is not particularly limited in this application.

In some embodiments, the interposer terminals correspond to the second-level interconnect terminals in terms of volume, size, geometry, composition, distribution, location, and number, such that when the second-level devices are precisely aligned to respective target locations on the first-level assembly, the interposer terminals and the second-level interconnect terminals can be precisely centered for stacked interconnection between the second-level devices and the first-level assembly as described below.

In some embodiments, in a direction perpendicular to the second-level first surface of the second-level device (or the interconnect layer of the first-level assembly), the sum of the heights of the second-level interconnect terminals and the interposer terminals is substantially less than the sum of the heights of the second-level first alignment solder parts and the second-level second alignment solder parts, such that the second-level interconnect terminals and the interposer terminals are also spaced apart from each other after the second-level first alignment solder parts and the second-level second alignment solder parts subsequently form second-level alignment solder joints, so as not to interfere with subsequent soldering of the second-level first alignment solder part and the second-level second alignment solder part, and prevent the second-level interconnect terminal and the transfer terminal from being pressed against each other and damaged upon subsequent soldering of the second-level first alignment solder part and the second-level second alignment solder part.

In some embodiments, as shown in FIG. 4G, a redistribution layer (RDL) trace 448 is formed first from bottom to top on the side of the molding compound 430 where the active surfaces 411 of the first-level semiconductor devices 410, 410' including the first-level interconnect bumps 412 are exposed, and then interposer pads 442 corresponding to the second-level interconnect bumps 442 of the second-level semiconductor device 450 are formed, respectively, to form conductive paths from the first-level interconnect bumps 412 to the corresponding interposer pads 442. Dielectric layer 445 is also formed during this process to electrically isolate the conductive paths, particularly when RDL traces 448 and/or interposer pads 452 are formed. In addition, second-level second alignment solder parts (e.g., second-level alignment pads 444) corresponding to the second-level first alignment solder parts (e.g., second-level alignment soldering bumps 454), respectively, are also formed on the dielectric layer 445. Thereby, the first-level semiconductor assembly 440 is formed.

In some embodiments, external interconnect terminals are further formed on the interconnect layer such that some of the first-level interconnect terminals and/or the interposer terminals are electrically connected to the external interconnect terminals through the interconnect layer. As an example, the conductive path between them is realized by the interconnect layer. In some embodiments, at this time, of the first-level interconnect terminals, including the first-level interconnect terminals electrically connected to the interposer terminals and the first-level interconnect terminals electrically connected to the external interconnect terminals, may be independent of each other or may at least partially overlap (i.e., a first-level interconnect terminal can be electrically connected to both an interposer terminal and an external interconnect terminal). In some embodiments, the external interconnect terminals are used to interconnect the final package (i.e., the integrated package of the first-level device and the second-level device) with device(s) at another stage or level (e.g., a semiconductor device, an interconnect board, or a PCB board). Therefore, it is applicable to a situation in which the second-level device does not have a through electrode (such as TSV, TGV, PTH, or via), but is not excluded from the situation in which the second-level device is provided with a through electrode. For example, the external interconnect terminals may provide interconnection with device(s) at another stage or level together with the aforementioned additional interconnect terminals formed on the second surface of the second-level device (hereinafter referred to as "first external connection terminals" and "second external connection terminals" respectively for convenience of distinction), it being understood that the first external connection terminals need to be high enough (for example, when a first external connection terminal takes the form of a solder ball, the size of the solder ball is large enough) at this time, so that the first external connection terminal and the second external connection terminal are substantially in the same parallel plane (i.e., with respect to the first-level assembly) after the second-level device is aligned and fixed to the first-level assembly as described later, in order to achieve interconnection with device(s) at another level. As an example, the external interconnect terminals are distributed to be sufficiently spaced from the second-level second alignment solder parts so as not to be covered by a perpendicular projection of the second-level devices on the interconnect layer after the second-level devices are precisely aligned to the first-level assembly, so as not to affect stacking of subsequent second-level devices on the interconnect layer.

In some embodiments, as shown in FIG. 4G', based on FIG. 4G, the external interconnect terminals 446 are further formed so as to be sufficiently distanced from the second-level alignment soler pad 444, and conductive paths with at least some of the first-level interconnect bumps 412 are formed by RDL traces, as shown in FIG. 4G'.

S370—placing the at least one second-level device on the first-level assembly such that the second-level first alignment solder parts are substantially aligned with the second-level second alignment solder parts.

The meaning of "substantial alignment" herein is similar to the aforementioned description about the "substantial alignment" between the first-level first alignment solder part and the first-level second alignment solder part in S320, and thus, the description thereof is omitted.

In some embodiments, when the second-level device is placed on the first-level assembly in step S370, the second-level first surface of the second-level device (i.e., the surface formed with the second-level second alignment solder parts) faces the first-level assembly.

Figure 4H:
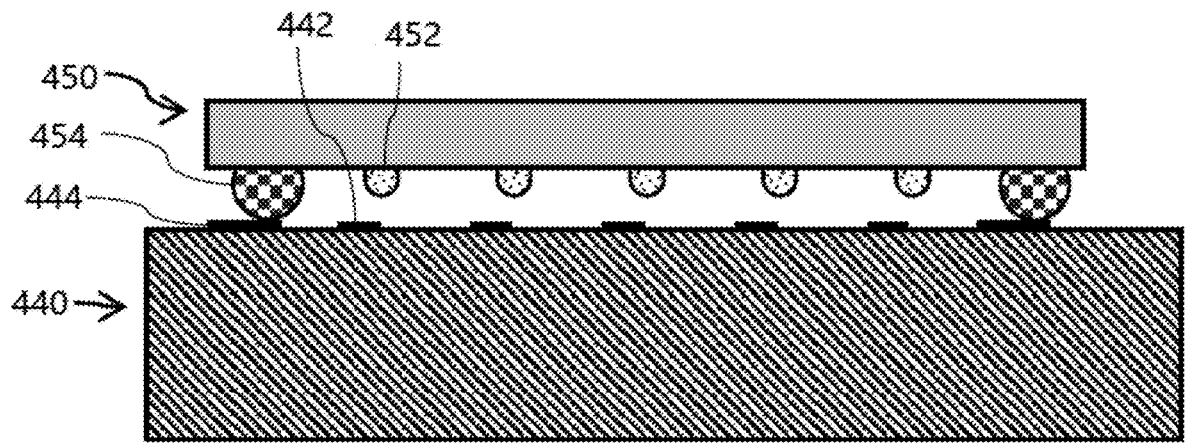

In some embodiments, as shown in FIG. 4H, the second-level device 450 is placed on the first-level semiconductor assembly 440 such that the second-level alignment solder bumps 454 contact corresponding second-level alignment pads 444. At this point, second-level alignment solder bump 454 can be misaligned with second-level alignment pad 444.

S380—forming second-level alignment solder joints by soldering the second-level first alignment solder parts to the second-level second alignment solder parts such that the at least one second-level device is precisely aligned to the first-level assembly.

S380a—pressing the at least one second-level device and the first-level assembly toward each other while the second-level alignment solder joints are at least partially melted to respectively bond the second-level interconnect terminals and the interposer terminals to form interconnection joints.

The description of "forming second-level alignment solder joints by soldering the second-level first alignment solder parts to the second-level second alignment solder parts so that the at least one second-level device is precisely aligned to the first-level assembly" is similar to the description of step S330 in the above and is thus omitted here.

In some embodiments, after soldering the second-level first alignment solder parts and the second-level second alignment solder parts, the second-level first surface of the second-level device (including the second-level interconnect terminals) and the first-level assembly are spaced apart to form a space therebetween due to the height of the second-level alignment solder joints themselves (in a direction perpendicular to the second-level first surface of the second-level device) formed thereby.

In some embodiments, in S380a, while the at least one second-level device is in precise alignment with the first-level assembly and the second-level alignment solder joints are still in an at least partially molten state, the second-level interconnect terminals and the interposer terminals are respectively joined while the at least one second-level device and the first-level assembly are pressed toward each other. In other embodiments, after the at least one second-level device is precisely aligned and secured to the first-level assembly, the second-level alignment solder joints are again at least partially melted, and the second-level interconnect terminals and the interposer terminals are respectively joined while pressing the at least one second-level device and the first-level assembly toward each other in S380a.

In some embodiments, the second-level interconnect terminals and/or the interposer terminals have the form of solder bumps and thus include solder, and the second-level interconnect terminals and the interposer terminals are soldered to form interconnection joints in S380a. In some embodiments, the second-level interconnect terminals and/or the interposer terminals do not contain solder, and the second-level interconnect terminals and the interposer terminals are bonded by Thermal Compression Bonding (TCB) in S380a.

Figure 4I:
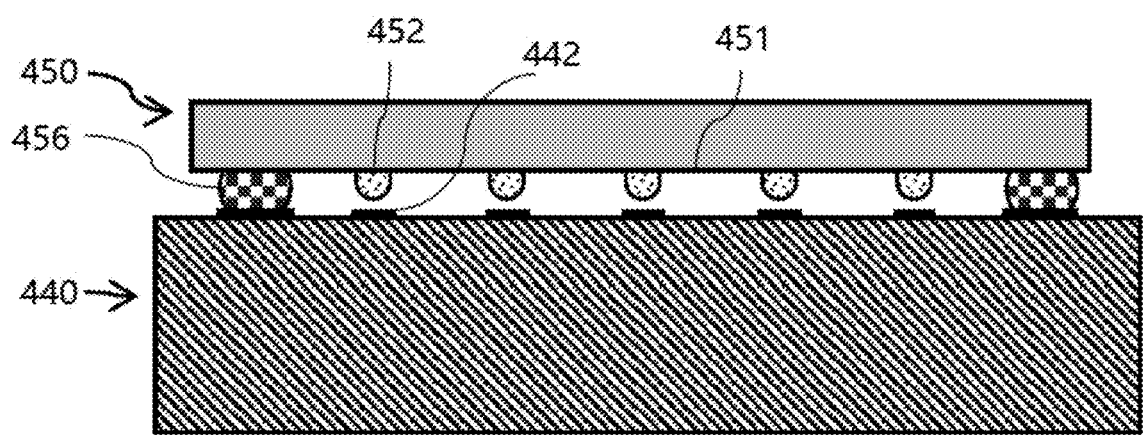
Figure 4J:
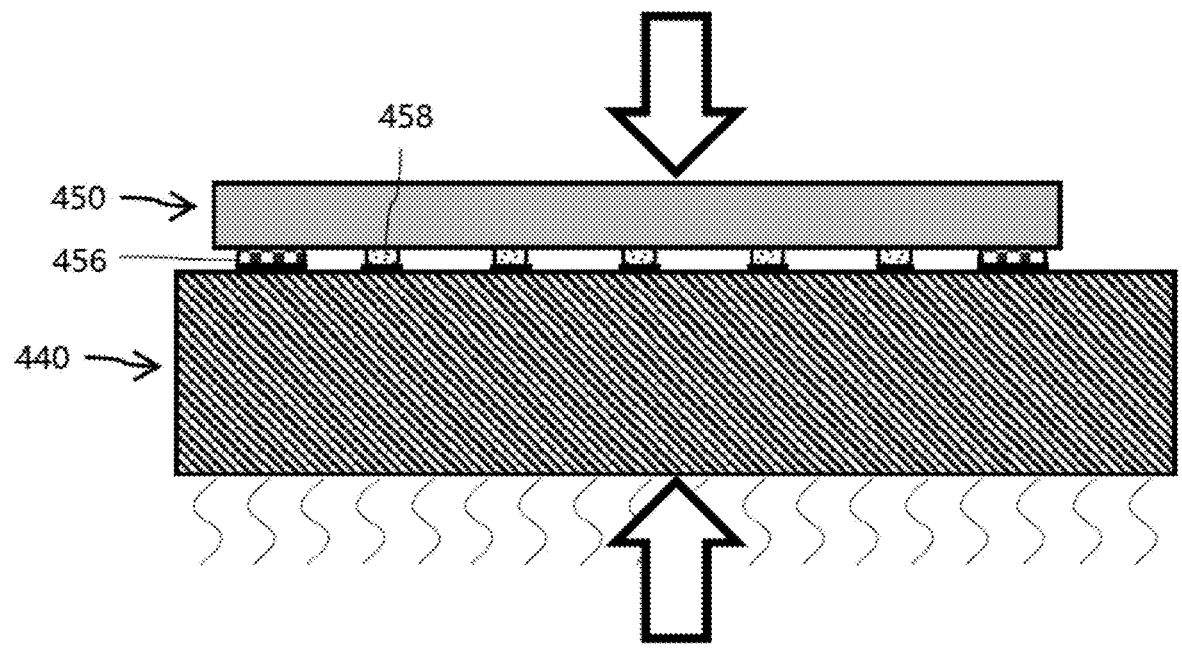

In some embodiments, second-level alignment solder bumps 454 and second-level alignment pads 444 are soldered to form second-level alignment solder joints 456, as shown in FIG. 4I. During the soldering process, the molten second-level alignment solder bumps 454 wets the second-level alignment solder pads 444 and self-aligns with the second-level alignment solder pads 444 based on its minimum surface energy principle, so as to drive the second-level device 450 to achieve precise alignment on the first-level semiconductor assembly 440. After the bonding is completed, the active surface 451 of the second-level device 450 is spaced apart from the first-level semiconductor assembly 440 to form a space. Then, as shown in FIG. 4J, heating is applied while the second-level device 450 and the first-level semiconductor assembly 440 are pressed toward each other. At this point, the second-level alignment solder joints 456 again at least partially melt and are further flattened, and the second-level interconnect bumps 452 (also in an at least partially molten state) subsequently come into contact with the interposer pads 442 and form second-level interconnect joints 458.

In some embodiments, the second-level alignment solder joints are heated to an at least partially molten state after the structure as a whole is flipped to further improve the self-alignment accuracy by taking advantage of the weight of the second-level device, e.g., in a process similar to that employed in S330, as discussed above.

S390—releasing the pressing.

In some embodiments, the pressing is released after the second-level alignment solder joints and/or the interconnect joints is at least partially cured to secure the at least one second-level device to the first-level assembly. In some embodiments, the time required for the second-level alignment solder joints and/or the interconnect joints to at least partially solidify to secure the at least one second-level device to the first-level assembly is predictable from theory and experience or measurable by prior experimentation, and the pressing may be relieved after such time has elapsed according to some embodiments.

In some embodiments, when the carrier board does not have the interconnect structure or the product function, the packaging method further includes removing the carrier board. As an example, the carrier board can be removed in any one step or between any two steps from S340 to S390.

In some embodiments, the carrier board is removed by lift-off, etching, ablation, grinding, and the like, as known in the art. As an example, when a peeling process is used, the solder between the carrier board and the first-level device (i.e. the first-level alignment solder joint) may be de-soldered to facilitate peeling the carrier board from the molded package body.

In some embodiments, some or all of the first-level alignment solder joints are also removed while or after the carrier board is removed. By way of example, some or all of the first-level alignment solder joints may be removed by de-soldering, etching, ablating, or grinding, among other processes known in the art. In some embodiments, some or all of the first-level alignment solder joints are left as part of the final semiconductor assembly (i.e., the final package) for electrical connections (e.g., power and ground), heat sinking, mechanical structures, and the like.

In some embodiments, after removing the carrier board, the method 300 further comprises thinning (such as grinding, etching or ablating and the like) the surface of the molded package body, from which the carrier board is removed. By way of example, thinning to remove some of the molded enclosure (including some of the remaining first-level alignment solder joints) from the first-level second surface side of the first-level device, or thinning to the first-level second surface of the first-level device, or thinning to include some of the first-level second surface side of the first-level device. In some embodiments, first-level alignment solder joints remaining after the carrier is removed are also removed by the thinning process. Thereby, the thickness of the final semiconductor assembly can be further reduced.

Figure 4K:
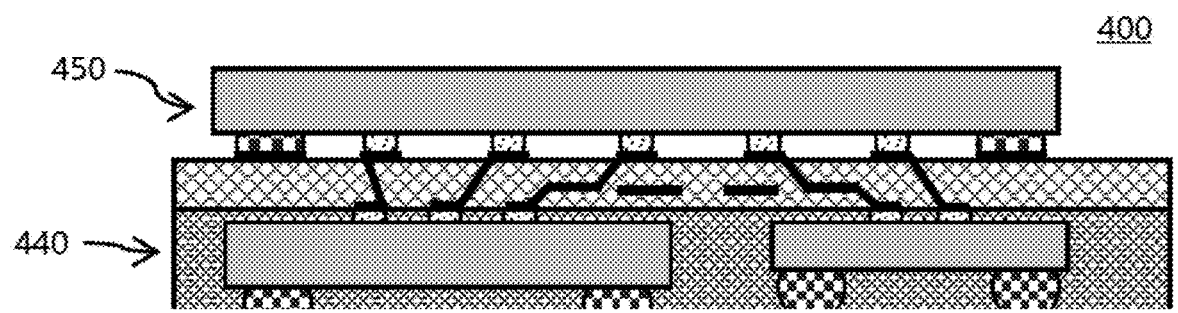

In some embodiments, as shown in FIG. 4K, after heating is released when second-level alignment solder joints 456 and second-level interconnect joints 458 are substantially solidified, the pressing is released. Carrier board 420 (and part or all of first-level alignment solder joints) are then removed by de-soldering first-level alignment solder joints 416, thereby forming semiconductor assembly 400.

In some embodiments, a space is formed between the second-level device and the first-level assembly due to the height of the second-level alignment solder joints and/or the interconnect joints. In some embodiments, the method 300 further comprises underfilling a space formed between the second-level device and the first-level assembly.

In some embodiments, passive devices are packaged with the at least one first-level device into a first-level assembly in substantially the same manner as the embodiments described above.

In some embodiments, after S390, the method 300 further comprises dicing the molded package body with or without the package board to obtain individual semiconductor components.

In some embodiments, a dicing process may be performed to fabricate individual semiconductor components according to the package specifications, or may not be performed.

Figure 5B:
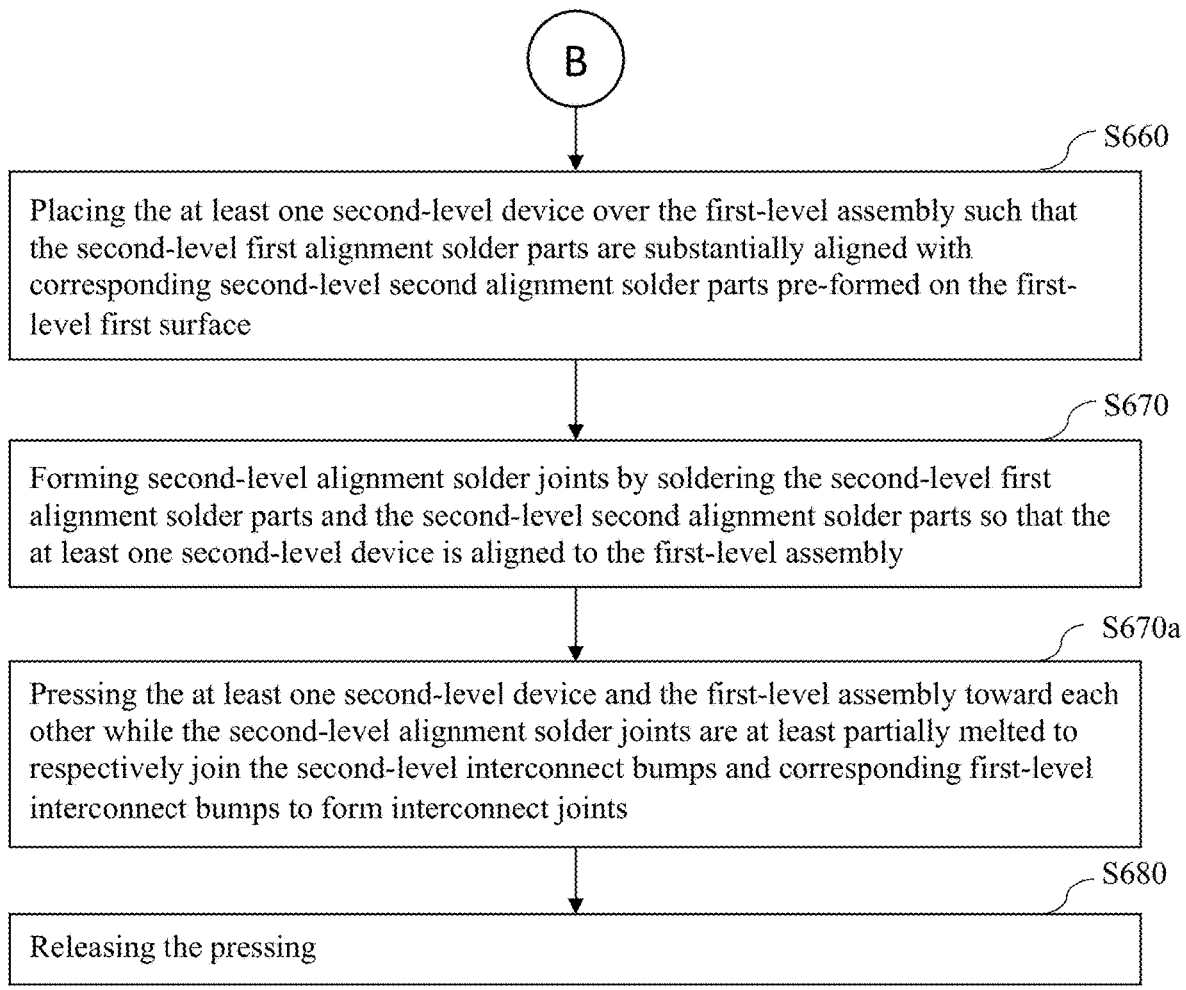

FIGS. 5A-5B show a flow chart of a packaging method 600 according to further embodiments. As shown, the packaging method 600 includes the steps S610 to S680, which are described below. Packaging method 600 differs from packaging method 300 described above mainly in that the first-level interconnect terminals of the first-level devices are not fanned out using, for example, an interconnect layer, but rather are directly interconnected with the second-level interconnect terminals of the second-level devices (which are interconnect bumps or a combination of interconnect bumps and second-level first alignment solder joints). Therefore, in order to avoid unnecessarily obscuring other inventive concepts, description of the parts of the packaging method 600 that are similar to corresponding parts of the packaging method 600 will be omitted from the following description, for which reference is made to the description of the corresponding parts of the method 300 in the above.

S610—providing at least one first-level (or first-stage) device, at least one second-level (or second-stage) device, and a carrier board. In some embodiments, the at least one first-level device has at least one first-level first surface and at least one first-level second surface opposite to each other, the at least one first-level first surface is formed with first-level interconnect terminals thereon, and the at least one first-level second surface is formed with first-level first alignment solder parts thereon. In some embodiments, the at least one second-level device has at least one second-level first surface and at least one second-level second surface opposite to each other, the at least one second-level first surface is formed with second-level interconnect terminals and second-level first alignment solder parts thereon. The carrier board is formed with first-level second alignment solder parts respectively corresponding to the first-level first alignment solder parts. In some embodiments, the first-level interconnect terminals of the first-level device and at least some of the second-level interconnect terminals of the second-level device are in the form of interconnect bumps.

In some embodiments, in order to interconnect at least some of the first-level interconnect bumps of the at least one first-level device with the second-level interconnect bumps of the at least one second-level device without fan-out, at least some of the first-level interconnect bumps need to correspond in volume, size, geometry, composition, distribution, location, and number, etc., with the corresponding second-level interconnect bumps, enabling at least some of the plurality of first-level interconnect bumps to be precisely aligned with the plurality of second-level interconnect bumps for stack interconnection between the at least one second level device and the first level assembly when the at least one second-level device is precisely aligned to a corresponding target location on the first-level assembly including the at least one first-level device.

In some embodiments, the second-level interconnect bumps correspond to the first-level interconnect bumps, respectively. Alternatively, the second-level interconnect bumps and the second-level first alignment solder parts together serve as second-level interconnect terminals on the second-level first surface of the at least one second-level device and the second-level interconnect terminals correspond to the first-level interconnect bumps, respectively.

Figure 6A:
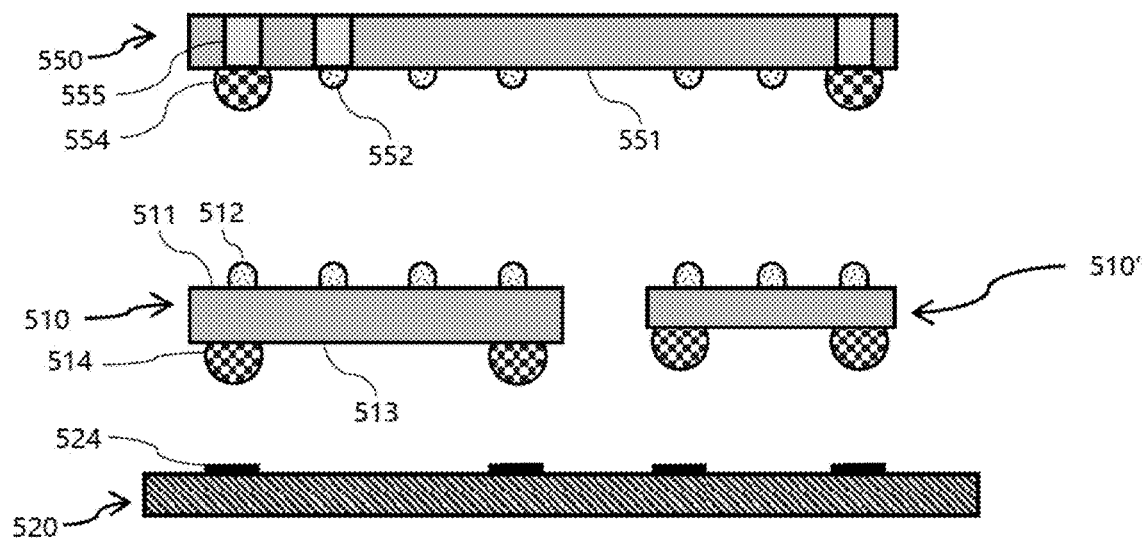
FIG. 6A to 6E show cross-sectional views for schematically illustrating a packaging method and a package according to some embodiments.

As an exemplary embodiment, as shown in FIG. 6A, two first-level semiconductor devices 510, 510', a second-level semiconductor device 550, and a carrier board 520 are provided. The two first-level semiconductor devices 510, 510' are not identical, e.g., they differ in size and/or function. It is to be appreciated that although only the reference numerals of the relevant portions of the first-level semiconductor device 510 are shown in FIG. 6A for ease of illustration and the description below is made in conjunction therewith, the description applies equally to the corresponding similar portions of the first-level semiconductor device 510'. The first-level semiconductor devices 510, 510' are formed with first-level interconnect bumps 512 distributed over the active surfaces 511 thereof and first-level alignment solder bumps 514 formed over the passive surfaces 513 thereof. The second-level semiconductor device 550 is formed with second-level interconnect bumps 552 and second-level first alignment solder parts 554 distributed on the active surface 551 thereof as second-level interconnect terminals corresponding to the first-level interconnect bumps 512, respectively, and the second-level device 550 is further provided with TSVs 555 electrically connected to the second-level first alignment solder parts 554 and some of the second-level interconnect bumps 552, respectively. First-level second alignment solder parts (e.g., first-level alignment pads 524) are formed on a surface of the carrier 520 in the same arrangement (or relative positions) as the first-level first alignment solder parts (e.g., first-level alignment bumps 514) on the first-level semiconductor devices 510 and 510'.

S620 to S640 are similar to S320 to S340, respectively, described above. Thus, the description thereof is omitted here.

S650—exposing the first-level interconnect bumps from the molded package body.

Figure 6B:
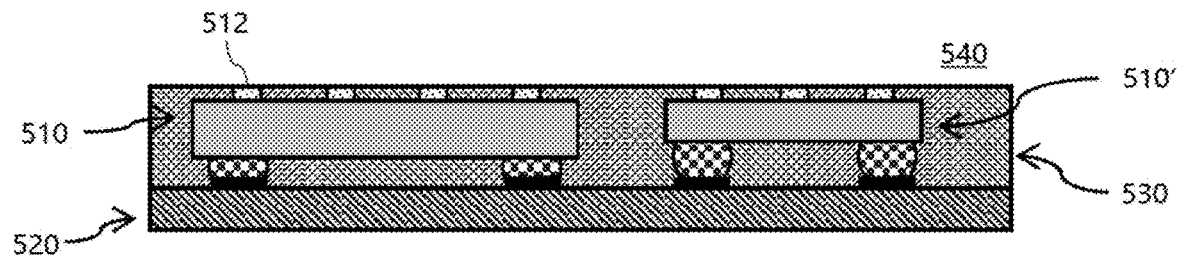

As an exemplary embodiment, as shown in FIG. 6B, the molded package body 540 is thinned from the side near the active surface 511 of the first-level devices 510, 510' to expose the first-level interconnect bumps 512, thereby forming the first-level semiconductor assembly 540.

S660—placing the at least one second-level device on the first-level assembly such that the second-level first alignment solder parts are substantially aligned with second-level second alignment solder parts on the first-level assembly. In some embodiments, the second-level second alignment solder parts are pre-formed on a side of the first-level assembly that exposes the first-level interconnect bumps and correspond with the second-level first alignment solder parts, respectively.

In some embodiments, when the second-level interconnect bumps correspond to the first-level interconnect bumps, respectively, the method 600 further comprises, between S650 and S660: forming the second-level second alignment solder parts on a side of the first-level assembly where the first-level interconnect bumps are exposed. As an alternative embodiment, when the second-level first alignment solder parts have the form of alignment solder bumps, the first-level device is further formed with the second-level second alignment solder parts having the form of alignment bumps on the first-level first surface in S610.

In some embodiments, when the second-level interconnect bumps and the second-level first alignment solder parts together serve as second-level interconnect terminals on the second-level first surface of the at least one second-level device, the second-level interconnect terminals respectively corresponding to the first-level interconnect bumps, and the second-level first alignment solder parts have the form of alignment solder bumps, some of the first-level interconnect bumps respectively corresponding to the second-level first alignment solder parts would serve as the second-level second alignment solder parts in S660. As an alternative embodiment, when the second-level interconnect bumps and the second-level first alignment solder parts together serve as second-level interconnect terminals on the second-level first surface of the at least one second-level device, and the second-level interconnect terminals respectively correspond to the first-level interconnect bumps, the method 600 further comprises, between S650 and S660: forming the second-level second alignment solder parts having the form of alignment solder bumps on some of the first-level interconnect bumps corresponding to the second-level first alignment solder parts, respectively.

In some embodiments, in a direction perpendicular to a second-level first surface of the second-level device (or a side surface of the first-level assembly exposing the first-level interconnect bumps), a height of each second-level interconnect bump is sufficiently less than a height of each second-level first alignment solder parts, such that the second-level interconnect bump are spaced apart from corresponding first-level interconnect bumps after the second-level first alignment solder parts and the second-level second alignment solder parts form second-level alignment solder joints.

Figure 6C:
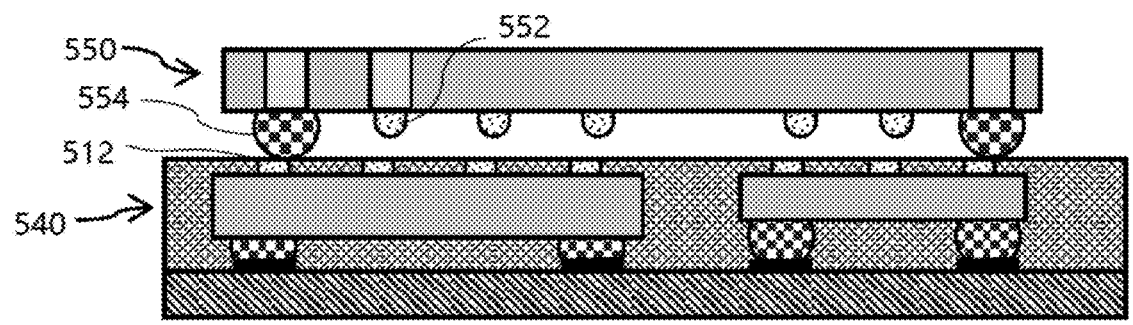

As an exemplary embodiment, the second-level semiconductor device 550 is placed on the first-level semiconductor assembly 540 such that the second-level alignment solder bumps 554 contact corresponding first-level interconnect bumps 512, as shown in FIG. 6C. At this point, the second-level alignment solder bumps 554 are not aligned with the corresponding first-level interconnect bumps 512.

S670—forming second-level alignment solder bumps by soldering the second-level first alignment solder bumps and the second-level second alignment solder bumps such that the at least one second-level device is precisely aligned to the first-level assembly.

S670a—pressing the at least one second-level device and the first-level assembly toward each other while the second-level alignment solder bumps are at least partially melted to respectively bond the second-level interconnect bumps and the corresponding first-level interconnect bumps to form interconnection joints.

In some embodiments, in S670, while the at least one second-level device is in precise alignment with the first-level assembly and the second-level alignment pads are still in an at least partially molten state, the second-level interconnect bumps and corresponding first-level interconnect bumps are respectively bonded while the at least one second-level device and the first-level assembly are pressed toward each other. In other embodiments, in S670, after the at least one second-level device is precisely aligned and secured to the first-level assembly, the second-level alignment pads are again at least partially melted and the second-level interconnect bumps and corresponding first-level interconnect bumps are respectively bonded while the at least one second-level device and the first-level assembly are pressed toward each other.

In some embodiments, the second-level interconnect bumps include solder, and the second-level interconnect bumps and the corresponding first-level interconnect bumps are respectively soldered to form interconnect pads in S670. In some embodiments, the second-level interconnect bumps do not include solder, and the second-level interconnect bumps and corresponding first-level interconnect bumps are thermocompression bonded in S670.

Figure 6D:
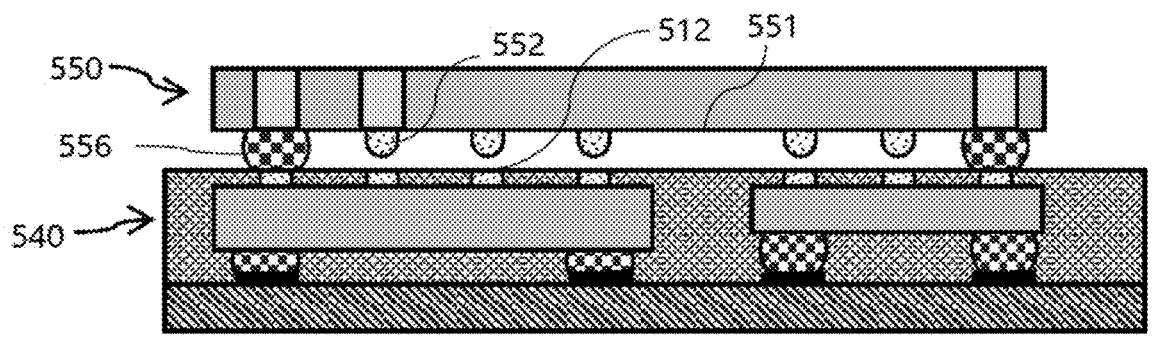
Figure 6E:
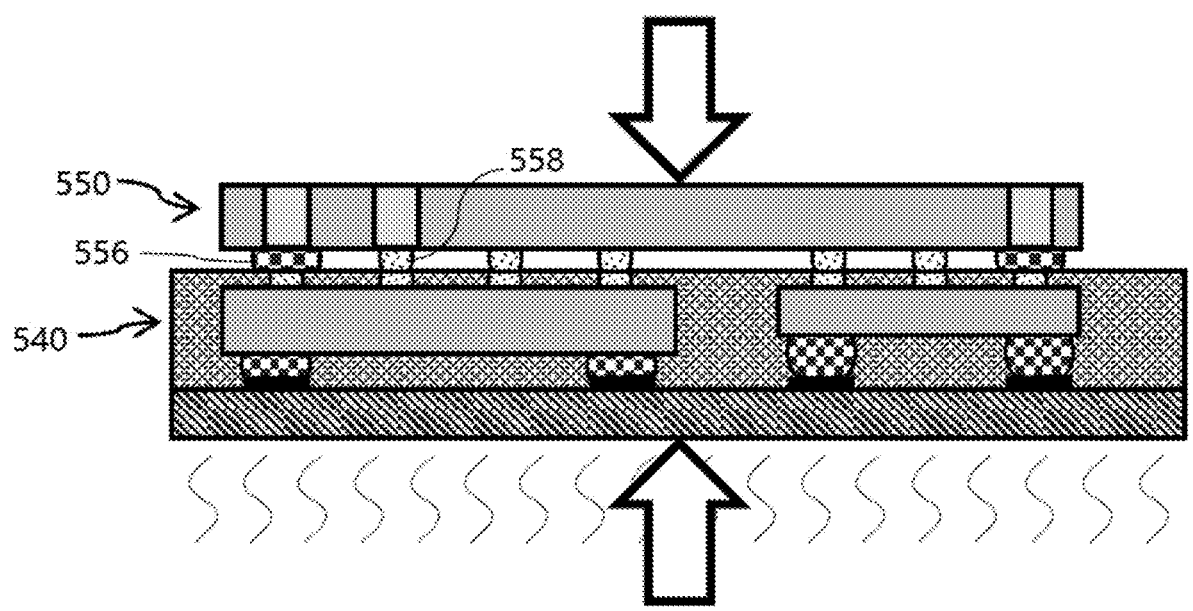

In some embodiments, the second-level alignment solder bumps 554 and corresponding first-level interconnect bumps 512 are soldered to form second-level alignment solder joints 556, as shown in FIG. 6D. During the soldering process, each molten second-level alignment solder bump 554 wets the corresponding first-level interconnect bump 512 (which act as a second-level second alignment solder part) and self-aligns with the corresponding first-level interconnect bump 512 based on its minimum surface energy principle to form a second-level alignment solder joint 556, so as to drive the second-level device 550 to achieve precise alignment on the first-level semiconductor assembly 540. After the bonding is completed, the active surface of the second-level device 550 is spaced apart from the first-level semiconductor assembly 540 to form a space. Then, as shown in FIG. 6E, heating is performed while pressing the second-level device 550 and the first-level semiconductor assembly 540 toward each other. At this point, the second-level alignment solder joints 556 again at least partially melt and are further flattened, and the second-level interconnect bumps 552 (also in an at least partially molten state) subsequently come into contact with the first-level interconnect bumps 512 and form second-level interconnect solder joints 558.

S680 is similar to S390 described previously. Thus, the description thereof is omitted here.

It is apparent that those skilled in the art can make various changes and modifications to the embodiments of the present application without departing from the spirit and scope of the application. Thus, to the extent that such modifications and variations fall within the scope of the claims and their equivalents, it is intended that the present disclosure encompass such modifications and variations as well.

What is claimed is:

1. A semiconductor packaging method, comprising:
  forming a first-level assembly, including:
    providing at least one first-level device, at least one second-level device, and a carrier board, wherein the at least one first-level device has at least one first-level first surface formed with first-level interconnect terminals and at least one opposing first-level second surface formed with first-level first alignment solder parts, the at least one second-level device has at least one second-level first surface formed with second-level interconnect terminals and second-level first alignment solder parts, and the carrier board is formed with first-level second alignment solder parts respectively corresponding to the first-level first alignment solder parts;
    placing the at least one first-level device on the carrier board such that the first alignment solder parts are substantially aligned with respective ones of the second alignment solder parts;
    forming first-level alignment solder joints by soldering the first-level first alignment solder parts to respective ones of the first-level second alignment solder parts to align and fix the at least one first-level device to one side of the carrier board;

encapsulating the at least one first-level device on the side of the carrier board in a molding compound to form a molded package body on the side of the carrier board;

exposing the first-level interconnect terminals from the molded package body;

sequentially forming an interconnect layer and interposer terminals corresponding to the second-level interconnect terminals on a side of the molded package body where the first-level interconnect terminals are exposed such that at least some of the first-level interconnect terminals are respectively electrically connected to the interposer terminals, through the interconnect layer; and forming second-level second alignment solder parts corresponding to the second-level first alignment solder parts, respectively, on the interconnect layer;

placing the at least one second-level device over the first-level assembly such that the second-level first alignment solder parts are substantially aligned with the second-level second alignment solder parts;

forming second-level alignment solder joints by soldering the second-level first alignment solder parts and the second-level second alignment solder parts so that the at least one second-level device is aligned to the first-level assembly;

pressing the at least one second-level device and the first-level assembly toward each other while the second-level alignment solder joints are at least partially melted to respectively join the second-level interconnect terminals and the interposer terminals to form interconnect joints; and releasing the pressing.

2. The semiconductor packaging method according to claim 1, wherein the at least one first-level device and the at least one second-level device includes at least one of a semiconductor device and an interconnect board, the interconnect board being an interposer or a substrate.

3. The semiconductor packaging method according to claim 1, wherein at least one of the at least one first-level device and the at least one second-level device further includes a through electrode.

4. The semiconductor packaging method according to claim 1, wherein a sum of heights of a second-level interconnect terminal and a corresponding interposer terminal is less than a sum of heights of a second-level first alignment solder part and a corresponding second-level second alignment solder part, such that the second-level interconnect terminals are spaced apart from the interposer terminals after the second-level first alignment solder parts and the second-level second alignment solder parts form second-level alignment solder joints.

5. The semiconductor packaging method according to claim 1, further comprising forming external interconnect terminals on the interconnect layer, wherein at least some of the first-level interconnect terminals and interposer terminals are respectively electrically connected to the external interconnect terminals through the interconnect layer.

6. The semiconductor packaging method according to claim 1, wherein:

respectively joining the second-level interconnect terminals and the interposer terminals to form interconnect joints includes, while the at least one second-level device is in alignment with the first-level assembly and the second-level alignment solder joints are in an at least partially molten state, pressing the at least one second-level device and the first-level assembly toward each other; or respectively joining the second-level interconnect terminals and the interposer terminals to form interconnect joints includes, after the at least one second-level device is in alignment with the first-level assembly, applying heat to melt the second-level alignment solder joints again and pressing the at least one second-level device and the first-level assembly toward each other while the second-level alignment solder joints are in a molten or partially molten state.

7. The semiconductor packaging method according to claim 6, wherein the external interconnect terminals are spaced apart from the second level second alignment solder parts so as not to be covered by a perpendicular projection of the at least one second-level device on the interconnect layer after the at least one second-level device is aligned with the first-level assembly.

8. The semiconductor packaging method according to claim 1, wherein:

the second-level interconnect terminals are interconnect bumps, and the interposer terminals are interposer bumps or interposer pads; or the second-level interconnect terminals are interconnect pads and the interposer terminals are interposer bumps.

9. The semiconductor packaging method according to claim 8, wherein:

the interconnect bumps are solder bumps and respectively joining the second-level interconnect terminals and the interposer terminals includes soldering the second-level interconnect terminals to respective ones of the interposer terminals to form interconnect joints; or the interconnect bumps do not include solder and respectively joining the second-level interconnect terminals and the interposer terminals includes bonding the second-level interconnect terminals and respective ones of the interposer terminals by thermocompression bonding.

10. A semiconductor component packaged using the semiconductor packaging method of claim 1.

11. A semiconductor packaging method, comprising:

forming a first-level assembly, including:

providing at least one first-level device, at least one second-level device, and a carrier board, wherein the at least one first-level device has at least one first-level first surface formed with first-level interconnect bumps and at least one opposing first-level second surface formed with first-level first alignment solder parts, the at least one second-level device has at least one second-level first surface formed with second-level interconnect bumps and second-level first alignment solder parts, and the carrier board is formed with first-level second alignment solder parts respectively corresponding to the first-level first alignment solder parts;

placing the at least one first-level device on the carrier board such that the first-level first alignment solder parts are substantially aligned with respective ones of the first-level second alignment solder parts;

forming first-level alignment solder joints by soldering the first alignment solder parts to respective ones of the second alignment solder parts to align and fix the at least one first-level device to one side of the carrier board;

encapsulating the at least one first-level device on the side of the carrier board in a molding compound to form a molded package body on the side of the carrier board; and exposing the first-level interconnect bumps from the molded package body;

placing the at least one second-level device over the first-level assembly such that the second-level first alignment solder parts are substantially aligned with second-level second alignment solder parts on the first-level assembly;

forming second-level alignment solder joints by soldering the second-level first alignment solder parts and the second-level second alignment solder parts so that the at least one second-level device is aligned to the first-level assembly;

pressing the at least one second-level device and the first-level assembly toward each other while the second-level alignment solder joints are at least partially melted to respectively join the second-level interconnect bumps and corresponding ones of the first-level interconnect bumps to form interconnect joints; and releasing the pressing;

wherein a height of each second-level interconnect bump is less than a height of each second-level first alignment solder part, such that the second-level interconnect bumps are spaced apart from corresponding first-level interconnect bumps after the second-level first alignment solder parts and the second-level second alignment solder parts form second-level alignment solder joints.

* * * * *